(12) United States Patent
Kwan et al.

(10) Patent No.: US 9,645,977 B2
(45) Date of Patent: May 9, 2017

(54) SYSTEMS AND METHODS FOR CONFIGURING A HEADER AND LAYOUT OF A MOBILE VERSION OF A CONVENTIONAL WEBSITE

(75) Inventors: Jeff L. Kwan, Lexington, MA (US); Tristan C. Hale, Somerville, MA (US); Christopher M. LaPointe, Allston, MA (US)

(73) Assignee: Cimpress Schweiz GmbH, Winterthur (CH)

( * ) Notice: Subject to any disclaimer, the term of this patent is extended or adjusted under 35 U.S.C. 154(b) by 745 days.

(21) Appl. No.: 13/351,435

(22) Filed: Jan. 17, 2012

(65) Prior Publication Data

US 2013/0174014 A1    Jul. 4, 2013

Related U.S. Application Data

(62) Division of application No. 13/342,969, filed on Jan. 3, 2012, now Pat. No. 9,311,427.

(51) Int. Cl.
| | |
|---|---|
| *G06F 17/00* | (2006.01) |
| *G06F 17/20* | (2006.01) |
| *G06F 17/21* | (2006.01) |
| *G06F 17/30* | (2006.01) |
| *G06F 9/44* | (2006.01) |
| *G06F 17/50* | (2006.01) |
| *H04W 88/02* | (2009.01) |

(52) U.S. Cl.
CPC ............. *G06F 17/211* (2013.01); *G06F 8/36* (2013.01); *G06F 17/3089* (2013.01); *G06F 17/30905* (2013.01); *G06F 17/5022* (2013.01); *H04W 88/02* (2013.01)

(58) Field of Classification Search
CPC ............. G06F 17/30905; G06F 17/248; G06F 17/30899; G06Q 30/00
See application file for complete search history.

(56) References Cited

U.S. PATENT DOCUMENTS

| | | | |
|---|---|---|---|
| 6,055,522 A | 4/2000 | Krishna et al. | |
| 6,101,509 A * | 8/2000 | Hanson et al. | ............... 715/234 |
| 6,671,692 B1 | 12/2003 | Marpe et al. | |
| 7,987,271 B1 | 7/2011 | O'Toole, Jr. et al. | |

(Continued)

OTHER PUBLICATIONS

Meg Hughes, "Mobile Website of the Week: Find Girls at," Sep. 22, 2011, dudamobile.com, pp. 1-3.*

(Continued)

*Primary Examiner* — Ariel Mercado
(74) *Attorney, Agent, or Firm* — Jessica Costa

(57) ABSTRACT

A mobile website configuration system for enabling a user to configure, for display on a mobile device, a mobile-optimized website which corresponds to a conventional website. The system includes at least one computer processing unit executing and displaying a graphical user interface on a client machine. The graphical user interface includes a header configuration tool which configures the mobile-optimized website to have a user-selected header selected from a plurality of representations of header images. The graphical user interface further includes a layout configuration tool which configures the mobile-optimized website to have a user-selected layout selected from a plurality of representations of layout options.

18 Claims, 29 Drawing Sheets

(56) References Cited

U.S. PATENT DOCUMENTS

| | | |
|---|---|---|
| 8,196,035 B2 | 6/2012 | Sadan et al. |
| 8,204,734 B2 | 6/2012 | Zaki et al. |
| 8,589,142 B2 | 11/2013 | Ritts et al. |
| 8,719,001 B1 | 5/2014 | Izdepski et al. |
| 8,806,646 B1 | 8/2014 | Daswani et al. |
| 9,311,427 B2 | 4/2016 | Kwan et al. |
| 2001/0012281 A1 | 8/2001 | Hall et al. |
| 2001/0048436 A1 | 12/2001 | Sanger |
| 2004/0002843 A1 | 1/2004 | Robarts et al. |
| 2005/0240857 A1* | 10/2005 | Benedict ............ G06F 17/3089 715/205 |
| 2008/0072139 A1* | 3/2008 | Salinas et al. ................ 715/238 |
| 2008/0161006 A1 | 7/2008 | Ferrarto et al. |
| 2008/0235580 A1 | 9/2008 | Gonze et al. |
| 2009/0055758 A1 | 2/2009 | Sim et al. |
| 2009/0144041 A1 | 6/2009 | Goldsmith |
| 2009/0164300 A1 | 6/2009 | Gupta et al. |
| 2009/0270076 A1 | 10/2009 | Zhou et al. |
| 2010/0023865 A1 | 1/2010 | Fulker et al. |
| 2010/0037168 A1 | 2/2010 | Thayne et al. |
| 2010/0077321 A1* | 3/2010 | Shen et al. .................... 715/760 |
| 2010/0199197 A1* | 8/2010 | Faletski et al. ............... 715/760 |
| 2011/0125838 A1 | 5/2011 | Rao |
| 2011/0209046 A1 | 8/2011 | Huang et al. |
| 2012/0011468 A1 | 1/2012 | Zhang |
| 2012/0060087 A1* | 3/2012 | Jame et al. ................... 715/238 |
| 2012/0066632 A1 | 3/2012 | Sundermeyer et al. |
| 2012/0102087 A1 | 4/2012 | Chor |
| 2012/0155292 A1 | 6/2012 | Zazula et al. |
| 2012/0240063 A1 | 9/2012 | Andrade et al. |
| 2012/0266060 A1 | 10/2012 | Roberts et al. |
| 2013/0080887 A1 | 3/2013 | Hou |
| 2013/0282892 A1 | 10/2013 | Levi et al. |
| 2014/0033008 A1 | 1/2014 | Schaffel et al. |
| 2014/0040721 A1 | 2/2014 | Brownlow et al. |
| 2014/0081616 A1 | 3/2014 | Poulin |
| 2014/0143695 A1 | 5/2014 | Sundermeyer et al. |
| 2014/0173454 A1 | 6/2014 | Sanchez |
| 2015/0074516 A1 | 3/2015 | Ben-Aharon et al. |
| 2015/0154164 A1 | 6/2015 | Goldstein et al. |

OTHER PUBLICATIONS

Weebly, "Upload/Change Header Images," Jun. 12, 2011, weebly.com, pp. 1-5.*
Meg Hughes, "Mobile Website of the Week: Marry in Spain," dudamobile.com, pp. 1-3.*
Specialty Mobile Apps, "Specialty Mobile Apps Features," Nov. 23, 2011, specialtymobileapps.com, pp. 1-10.*
Meg Hughes, "Mobile Website of the Week: Kevin Sullivan Dental," Oct. 7, 2011, dudamobile.com, pp. 1-3.*
Online Tech Tips, " Quickly Make a Web Site Smartphone Compatible," Aug. 11, 2010, pp. 1-3.*
Chen, et al., "Function-Based Object Model Towards Website Adaptation," ACM 2001, pp. 587-596.
Book, et al., "Cost and Response Time Simulation for Web-Based Applications on Mobile Channels," IEEE 2005, pp. 1-8.
Hattori, et al., "Robust Web Page Segmentation for Mobile Terminal Using Content-Distances and Page Layout Information," ACM 2007, pp. 361-370.
Chen, et al., "Adapting Web Pages for Small-Screen Devices," IEEE 2005, pp. 50-56.

* cited by examiner

SYSTEMS AND METHODS FOR CONFIGURING A HEADER AND LAYOUT OF A MOBILE VERSION OF A CONVENTIONAL WEBSITE

REFERENCE TO PRIOR APPLICATION

This application is a divisional of prior application Ser. No. 13/342,969 filed on Jan. 3, 2012, which is hereby incorporated by reference in its entirety.

BACKGROUND

The present invention relates generally to techniques for building web-based content, and more particularly to techniques and tools for the automated generation of a website optimized for mobile devices based on an existing website.

Of the over half billion websites that exist today, most were designed and developed for viewing by, and interaction with, users via a traditional computer device—that is, a desktop or laptop computer having a relatively large display screen and a traditional QWERTY-type keyboard. In the past, such computer devices connected to the Internet first via wired connections, and then later more often via wireless connections. During this time, use of computer devices grew exponentially while simultaneously computer hardware grew smaller, faster, and more powerful. More recently, the addition of data connectivity capability to cellular phones, resulting in what is known as the "smartphone", has transformed not only the phone industry but also the rate of communication between such users and their accompanying expectations of such devices. Smartphone users now connect directly to the Internet and demand the same capabilities they would have had were they browsing the Internet using a traditional computer.

Recent research has suggested that at the end of 2011, more than 85% of all cell phones were connected to the Internet, with mobile data traffic expected to double every year for several years thereafter, and that by 2016, connections to the Internet via smartphones are predicted to outpace connection by desktop computers. The implications for business owners who want to be found on the Internet by customers, especially in local markets, will be profound.

The traditional website designed for viewing on a desktop or laptop often involves the download of a significant amount of data in order to capitalize on the relatively large amount of viewing space on the screen, and to implement interactive functionality, animations, video, and/or sound to attract visitors to the website. Websites designed for the traditional computing device can get away with such large data transfer due to the typically high-bandwidth data communication link that such devices use. However, while technology has certainly advanced to allow for increasingly greater data bandwidth and speed, the demand for data, both in terms of volume and speed, has still outpaced the current available communication link technologies. These considerations, coupled with the different physical attributes of the typical cell phone, such as its smaller screen size, smaller or even non-existent keyboard, and typically slower data communication link, require an owner of a website to at least consider creating a mobile-ready website that is optimized for mobile devices.

As mentioned, a typical mobile device such as a cell phone or pad computer, includes features, such as connection speed, user input mechanisms and screen size, that are fundamentally different than such features provided in a traditional computer device. Considering first the slower data connection that most mobile devices have in comparison to their desktop and laptop counterparts, in a mobile website it is desirable to reduce the amount of data required to be downloaded for each web page in order to provide a better response time when a user requests the web page. In addition to designing the mobile website to download less data, mobile websites may provide different user input controls than the traditional website. The traditional website typically includes navigation buttons, page scrolls, and other functional buttons which are manipulated by pointing, clicking, and other movements of a mouse cursor on the screen. This type of user interface is typically cumbersome for mobile device users, and additionally takes up valuable screen space. Another difference between traditional computer devices and mobile devices is the screen size. Traditional computer devices have larger screens and often place a lot of content on each page. Because screen space is at such a premium, traditional web pages that include a lot of content may be best displayed on a mobile device by breaking the content up into different pages, or by using many of the features, such as sliding, that are already natural to mobile device users. In summary, the end result of using the same website for both traditional computers and for mobile devices may be poor presentation of, and/or user frustration with, the website on the mobile device, which may result in lost customers to the business owner of the website.

All of the aforementioned differences between the mobile device as compared to the desktop or laptop device can lead to fundamental differences in the design of a website that is intended for display on mobile devices versus the website that is intended for display on a traditional computer. A website optimized for a mobile device is characterized by at least one of several optimization features, including utilizing content that is less data-intensive, and provisioning the website with mobile-appropriate user interface features.

Unfortunately, however, the idea of having to design of a mobile-ready website that is separate and different from their traditional website can be daunting to many website owners, as such process can be both time-consuming and costly. In essence, the cost and time required to design a mobile-ready website may be on the same order as that of the design of the original website. It would therefore be desirable to have a way to quickly and automatically generate a mobile-ready website. It would further be desirable to automatically match the mobile-ready website such that at least some of the content, and the look and feel, match that of an existing website. It would further be desirable to have an interactive user interface for editing a mobile website. It would still further be desirable to automatically, or allow a user to, incorporate features, icons, and functionality accessible on the Internet (such as, but not limited to, links to social media accounts, click-to-call, maps, directions, etc.) into the mobile website and to automatically configure the mobile website to enable the functionality of such features.

SUMMARY

Presented herein are techniques and tools for the automated generation of a website optimized for mobile devices based on an existing website. Embodiments of the invention includes systems and method for automatically generating a mobile-optimized website from an existing www. website, including automated matching of suitable mobile-optimized headers, automated generation of a matching color scheme/gradients/shadows based on a limited subset of colors from the www. website, automated addition of device-specific autodetection and configuration code in mobile web pages that include audio tags. Additional embodiments of the present invention include a mobile website design studio for editing and configuring a mobile website, including configuration and selection options for the mobile website header, layout, color scheme, and functional widget content. In one embodiment, the mobile website design studio includes a fully editable header. In yet another embodiment, the mobile website configuration engine includes a dynamically modifiable mobile device simulator.

DETAILED DESCRIPTION

Figure 1:
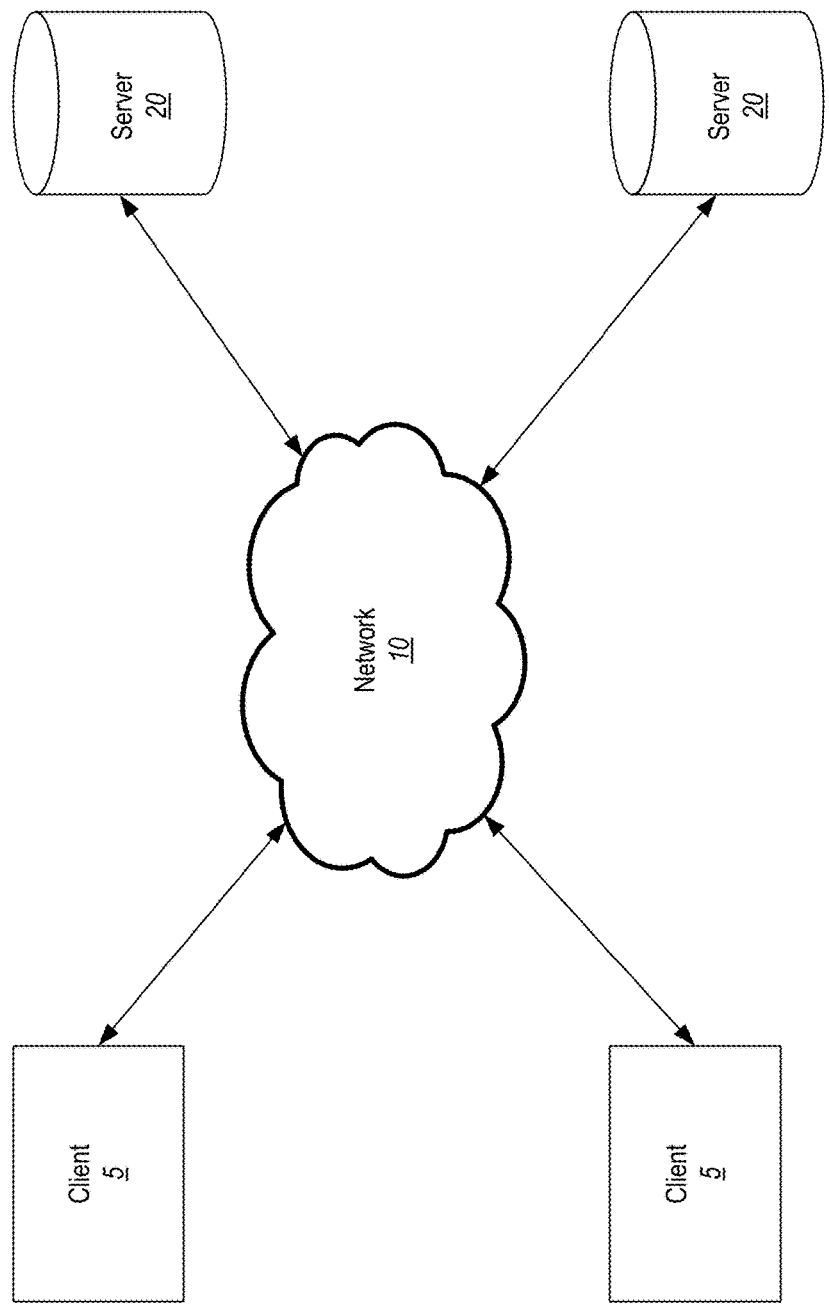
FIG. 1 is a block diagram of a networked client-server system.

Although the present invention is described below by way of various embodiments that include specific structures and methods, embodiments that include alternative structures and methods may be employed without departing from the principles of the invention described herein.

In general, embodiments described below feature a network-based application that automatically generates a web-site optimized for mobile devices based on an existing website. A preferred embodiment of the present invention features a network-based application for automatically converting assets of a designated website into corresponding assets of a mobile-ready website that are optimized for mobile devices. A preferred embodiment of the present invention may also feature a network-based design application which allows a user to edit and configure features of a mobile-ready website.

In one embodiment, the present invention is implemented as a web-based service that may be accessed through the Internet, for example, using a Web browser. The service provides an interface that allows a user to select a website and request the generation of a matching mobile-ready website. The request is received at a server which automatically generates a website optimized for mobile devices and which preferably matches the look-and-feel of the selected website. The service further provides a design environment which allows the user to make changes to the automatically generated mobile website and to publish the mobile website.

Further preferred embodiments of the present invention may feature automated matching of mobile-ready page headers to match the headers of the traditional website page headers, automated generation of a matching color scheme based on selected colors of the original website, and automated detection and configuration of appropriate audio players when the mobile website is loaded at a mobile device.

An introduction to Internet-related technology is helpful in understanding the present invention. The Internet is a vast and expanding network of computers and other devices linked together by various telecommunications media, enabling the various components to exchange and share data. Web pages and websites (collections of related web pages organized under a particular domain), accessible through Internet, provide information about numerous businesses, products and services, as well as education, research, and entertainment.

A resource that is attached to the Internet is often referred to as a "host." Examples of such resources include conventional computer systems that are made up of one or more processors, associated memory and other storage devices and peripherals, such as modems, networks interfaces and the like that allow for connection to the Internet or other networks. In most cases, the hosting resource may be embodied as hardware and/or software components of a server or other computer system that includes an interface module, which allows for some dialog with users and that may process information input by the user. Generally, such a server will be accessed through the Internet's graphical user interface, the World Wide Web, (e.g., via Web browsers) in the conventional fashion.

In order to facilitate communications between hosts, each host has a numerical Internet Protocol (IP) address. The IP address of a hypothetical host computer might be 69.17.223.11. Each host also has a unique "fully qualified domain name." In the case of the hypothetical host 69.17.223.11, the "fully qualified domain name" might be "computer.domain.com", the three elements of which are the hostname ("computer"), a domain name ("domain") and a top-level domain ("com"). A given host looks up the IP address of other hosts on the Internet through a system known as domain name service.

A page of a website is addressable by way of a Uniform Resource Locator, or "URL". A URL specifies three elements: (1) a transfer protocol; (2) a web server name or domain name; and (3) a path. The first element of the URL is a transfer protocol, most commonly "http" standing for hypertext transfer protocol, but others include "mailto" for electronic mail, "ftp" for file transfer protocol, and "nntp" for network news transfer protocol. The domain name indicates the name of the web server that stores the web page. The path indicates the location of web page on the named web server.

As previously indicated, in order to access the Internet most users rely on computer programs known as "Web browsers." Commercially available Web browsers include such well-known Web browser programs as MICROSOFT's INTERNET EXPLORER browser, APPLE's SAFARI browser, GOOGLE's CHROME browser, and MOZILLA's FIREFOX browser, to name a few. If an Internet user desires to view a Web page hosted at www.domain.com, the Internet user might enter into a Web browser program the uniform resource locator (URL) http://www.domain.com/

Once a URL is entered into the browser, the request is routed to a Domain Name System (DNS) server capable of matching the domain name specified in the URL to a corresponding IP address of a web server hosting the requested web page. Thus, the DNS server ultimately matches an alphanumeric name such as www.domain.com with its numeric IP address 69.17.223.11.

When a host receives a request from the Internet, it returns the data in the file pointed to by the request to the client making the request. Such data may make up a Web page, which may include a text message, sound, image, video, or a combination of such elements. A user can move between Web pages through the use of hyperlinks, which are links to other pages or locations on pages on the Internet.

An integral component of the present invention is a computer server. Servers are computer programs that provide some service to other programs, called clients. A client 5 and server 20 of FIG. 1 communicate by means of message passing often over a network 10, and use some protocol, a set of formal rules describing how to transmit data, to encode the client's requests and/or responses and the server's responses and/or requests. The server may run continually waiting for client's requests and/or responses to arrive or it may be invoked by some higher-level continually running server that controls a number of specific servers.

Architecture

Figure 2:
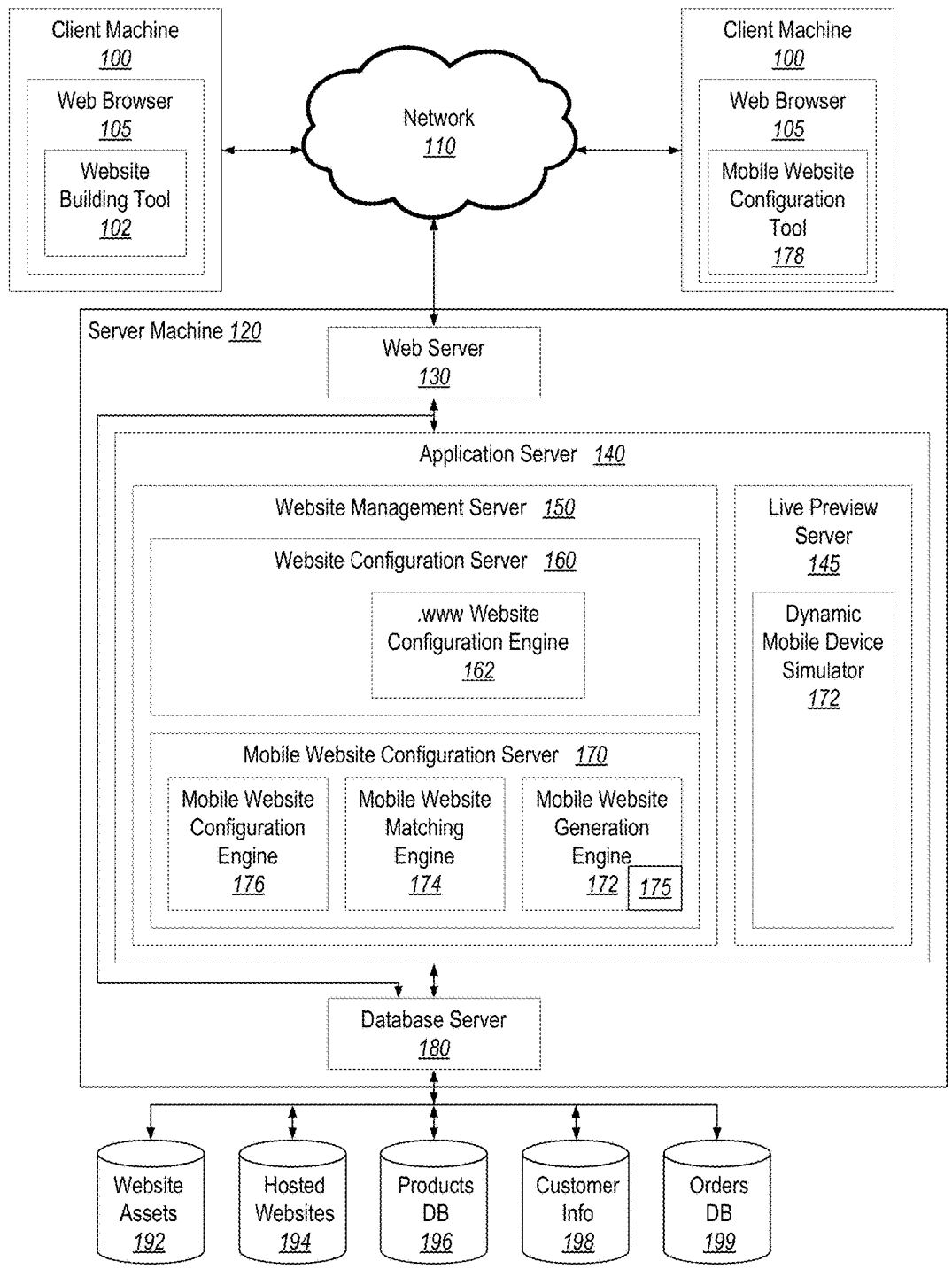
FIG. 2 is a block diagram illustrating an exemplary system architecture of a system in which embodiments of the present invention operate.

With these concepts in mind, an embodiment of a system architecture of the present invention is presented in FIG. 2. Services for automatically generating and configuring a mobile website may be accessed through client machines 100 that run browser applications 105 to provide graphical interfaces for a user to effectively use the mobile website services. The client machines 100 communicate with a server machine 120 via a network 110, e.g. Internet. The server machine 120 includes such components of the present invention as a web server 130, an application server 140, a Preview server 145, a website management server 150, a website configuration server 160, a mobile website configuration server 170, and a database server 180. It will be appreciated that these servers may run on other machines that are accessible by the server machine 120, and further that the server machine 120 may comprise one or more server machines working together to perform the functionality described herein. In an embodiment of the present invention, databases for storing website asset 192, hosted websites 194, product information 196, customer information 198, customer orders 199, etc. are also stored at the server machine 120. However, it will be appreciated that databases may be stored at other machines and database data may be uploaded to the server machine 120 when necessary.

The application server 140 comprises a website management server 150 that includes a website configuration server 160 and a mobile website configuration server 170. The mobile website configuration server 170 includes a mobile website generation engine 172, a mobile website matching engine 174, and a mobile website configuration engine 176. The mobile website generation engine 172 automatically generates a mobile version of an existing website such that the mobile version of the website is optimized for mobile devices. The mobile website generation engine 172 may utilize the services of the mobile website matching engine 174 to include mobile website assets that match at least some content and look and feel of the existing website. The mobile website configuration engine 176 allows a user, operating a client machine 100 and using a web browser 105, to configure features and make changes to the mobile website. Website assets, such as images, text content, audio files, etc. may be provided at the server machine, or alternatively, one or more website assets may be uploaded to the server by the user from the client machine 100. Website assets may be stored in one or more website asset databases 192.

A traditional website is a set of one or more web pages served by a web server at a particular domain name. A web page is typically a text document containing text and browser-interpretable instructions, such as the well-known Hypertext Markup Language (HTML or XHTML), Dynamic HTML (DHTML), Document Object Model (DOM), etc. A browser 105 running on a client machine 100 requests a web page by specifying the Universal Resource Locator (URL) of the specific page, and upon receiving the requested page from the server 120, renders the page on the user's display screen by processing and executing the browser-interpretable instructions. Web pages may be linked to other web pages by way of hyperlinks placed within the page(s). Typically, a hyperlink specifies a URL of a web page, a position in the web page, or a resource accessible by the server serving the web page.

A typical website consists of a home page that is served when the URL specifies the domain name without specifying a particular path (e.g., www.mycompany.com). Additional pages belonging to a website may be specified by way of the path following the domain name in the URL. For example, a "Contact Us" web page for the www.mycompany.com website may be specified as "www.mycompany.com/ContactUs", where the path "/ContactUs" in the URL indicates the location at the web server of the "Contact Us" web page.

Figure 3:
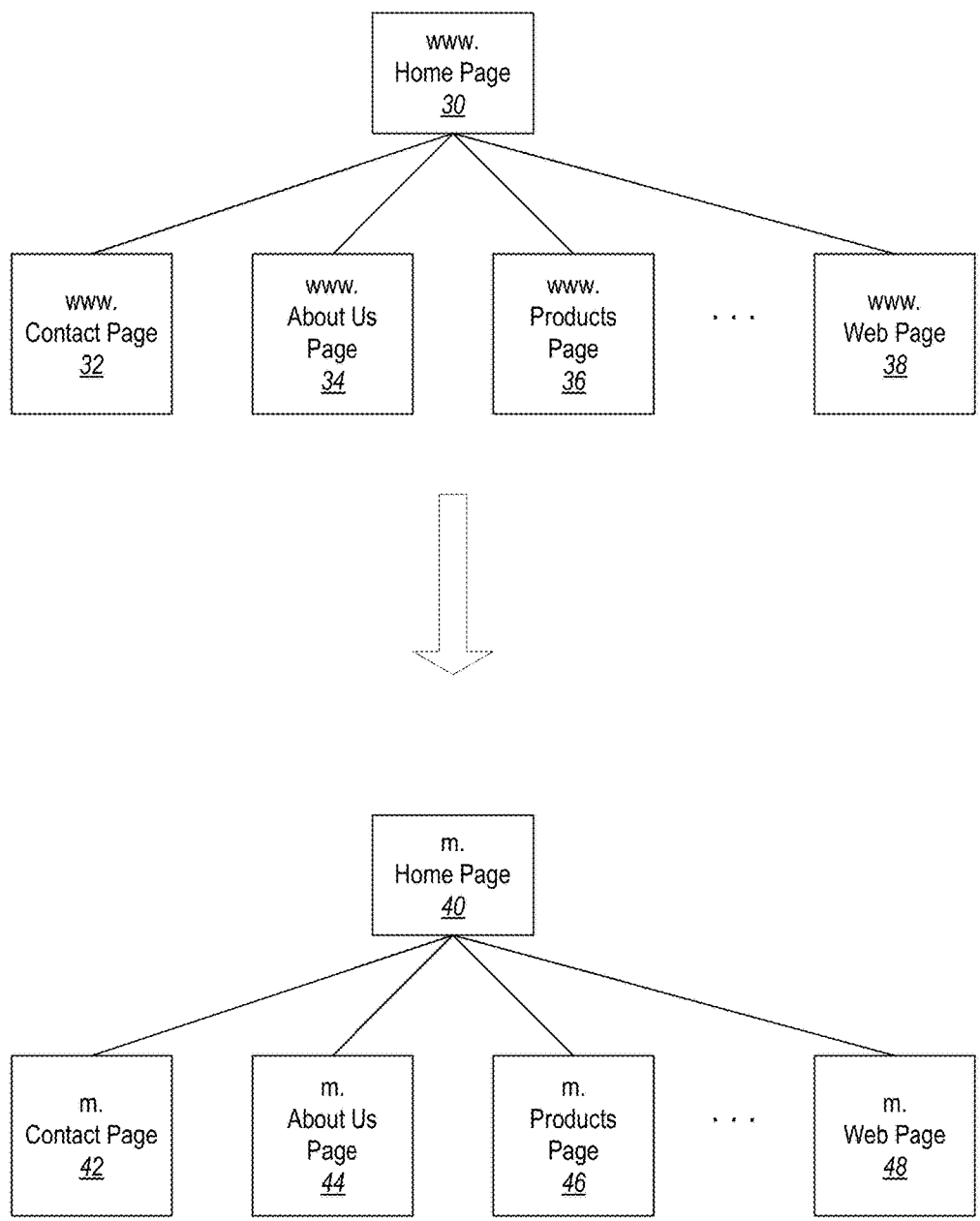
FIG. 3 is a block diagram illustrating a map of an exemplary website and its corresponding mobile-optimized website.

With reference now to FIG. 3, a website may consist of a plurality of related web pages 30, 32, 34, 36, 38, each comprising a browser-renderable document (for example, an HTML document). In the example shown in FIG. 3, a www. website includes a Home Page 30, a Contact page 32, an About Us page 34, a Products page 36, and one or more additional web pages 38. A corresponding mobile-ready website would then consist of a mobile-optimized Home page 40, a mobile-optimized Contact page 42, a mobile-optimized About Us page 44, a mobile-optimized Products page 46, and corresponding mobile-optimized additional web pages 48. For convenience of description, each of the various web pages of the conventional website is hereinafter referred to as a "www. web page" or a "www. document", while each of the various web pages of a corresponding mobile-optimized website is hereinafter referred to as a "m. web page" or a "m. document".

Returning to FIG. 2, in an embodiment, the conventional www. web pages are typically created and updated using an interactive configuration and editing tool 102, hereinafter referred to as a "website building tool". In one embodiment, the website building tool 102 is downloaded from the server 130 to the client machine 100 to run in the client browser 105. The website building tool 102 provides a graphical user interface that allows a creator or designer of a website to, among other actions, select page formats, add and modify content on the pages of the website, add or delete pages of the website, etc. Generally, the website building tool 102 receives user input for various formatting aspects, such as layout, color and/or color scheme, text fonts, content (including text, images, videos, audio, and scripts). The user input typically is received via a graphical user interface (GUI) that presents various options and input areas and translates the selected options and user input into a browser-renderable language such as HTML.

In an embodiment, during editing of a www. web page of a website, the website building tool 102 modifies a copy of a selected corresponding current web page of the site. The modified copy of the edited web page is not visible to the public until it gets published to the hosted websites database 194. The website building tool 102 includes a publish control (such as a button), which allows the user of the website building tool 102 to publish the edited page once he or she is satisfied with any changes made to the page.

In an embodiment, the website building tool 102 includes a preview function which allows the website owner to preview the changes made to the page prior to publishing it. To preview the changes, a Preview button may, when clicked by the user using a mouse or other input device, trigger the loading and rendering of the edited page into a browser for display to the user. The Publish button triggers the writing of the HTML version of the edited page to the hosted web pages database 194, overwriting the corresponding existing page if one exists.

In a preferred embodiment of the present invention, a corresponding mobile-optimized website (hereinafter a "m. website") is automatically created and/or updated when a conventional website (hereinafter referred to as a "www. website") is created and/or updated. This may happen in one of several ways. In one embodiment, a corresponding m. web page is created automatically and without user request by the mobile website generation engine 172 each time a www. web page is created by the user. The corresponding m. page preferably matches at least some content and the corresponding look and feel of the www. web page. In another preferred embodiment of the present invention, a m. website is initially created only when the user requests creation of the m. website. The mobile website generation engine 172 then operates in conjunction with the mobile website matching engine 174 to pull mobile website assets optimized for mobile devices from the website asset database 192 that match the website assets present on the www. website and to perform additional mobile-specific optimization to generate an initial m. website for the user.

In another preferred embodiment a mobile website configuration engine 176 allows a user to actively select and/or modify various configuration options including page layout, colors and color schemes, text fonts, content, and other features on the m. website.

Figure 4:
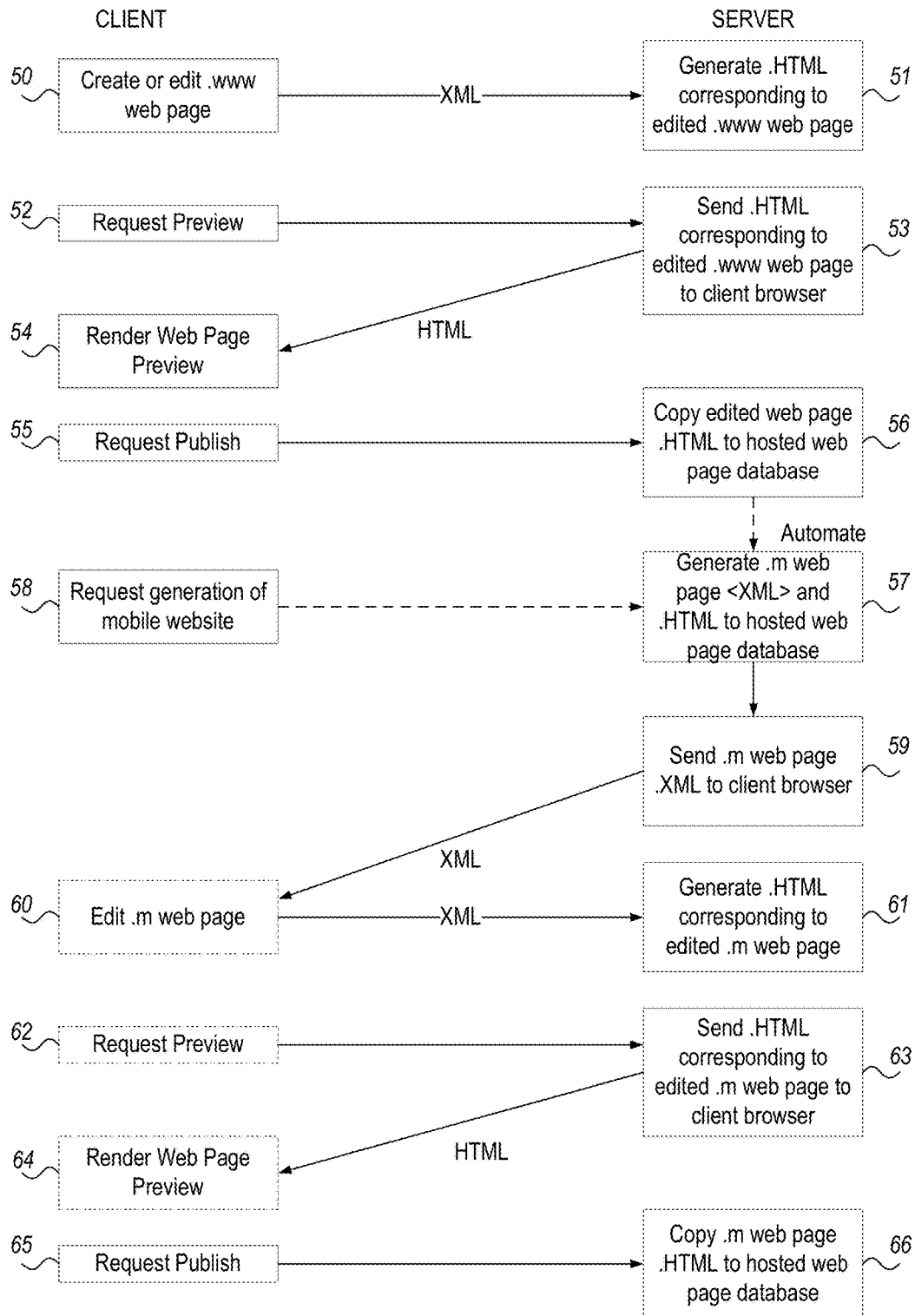
FIG. 4 is communications diagram illustrating the creation and publishing of a conventional website and its corresponding mobile-optimized website.

FIG. 4 is an operational diagram illustrating client-server actions and communications in accordance with an embodiment of the present invention. Initially, a www. web page is either created or an existing www. web page is edited (step 50). During editing and design on the client machine 100, the description and placement of the components may be abstracted from a .html browser-renderable format to a browser-independent XML-type format that describes the appearance and placement of various components (such as text containers, text content, image containers, image content, fonts, colors, layouts, etc.) of a particular www. web page. The XML page description is sent by the client 100 to the website configuration server 160, where the website configuration engine 162 generates a .html page (step 51). When the user (or the website configuration tool 178 running in the user's browser 105) requests a preview of the edited web page (step 52), the server 160 sends the .html web page corresponding to the edited page to the client machine 100, where it is rendered in the client's browser 105 (step 54). Steps 50 through 54 may be repeated until the user is satisfied with the edits.

The user may at some point request that the edited web page be published to the hosted website database 194 (step 55). The website management server 150, upon receipt of such request, instructs the database server 180 to write the .html web page corresponding to the edited web page to the hosted websites database 194 (step 56).

The mobile website configuration server 170 automatically generates a corresponding mobile-optimized version of the edited web page (step 57). This may occur either automatically at the direction of the website management server 150, or automatically upon request by the user (step 58). In an embodiment, the mobile website configuration server 170 triggers the automatic generation of a m. web page corresponding to the newly edited www. web page, preferably in both the <XML> format used by the mobile website configuration tool 178 and .html format renderable by web browsers 105 (step 59). The mobile website generation engine 172 communicates with the mobile website matching engine 174 to retrieve mobile-ready website assets (such as mobile-optimized headers, layouts, color schemes, content and functionality) from the website assets database 192 that match the look-and-feel of the conventional website assets of the user's www. website.

The user may view the system-generated m. website and decide to customize the configuration. The user may invoke the mobile website configuration tool 178, which sends the <XML> of at least one m. web page to the mobile website configuration engine 176 (step 59). The mobile website configuration tool 178 receives user input configuration selections and sends <XML> updates to the mobile website configuration engine 176 (step 60), which generates a corresponding .html page (step 63). When requested by the user or by the mobile configuration website configuration tool 178, the server sends the .html m. web page to the client 100 where it is rendered on the user's display screen in the browser 105 (step 64).

Eventually, the user may request that the changes made to the m. web page or m. website be published to the hosted websites database 194 (step 65). Upon receipt of such request from the client 100, the website management server 150 copies (and replaces any existing page if necessary) the new .html m. web page containing the changes made by the user through the mobile website configuration tool 178 to the hosted websites database 194 (step 66), where it becomes available to the public and accessible to be served by the web server 130.

Turning now to details of the mobile website generation engine 172, it is useful to first understand the various components of a conventional web page in order to understand how a conventional web page can be optimized for mobile devices.

Figure 5A:
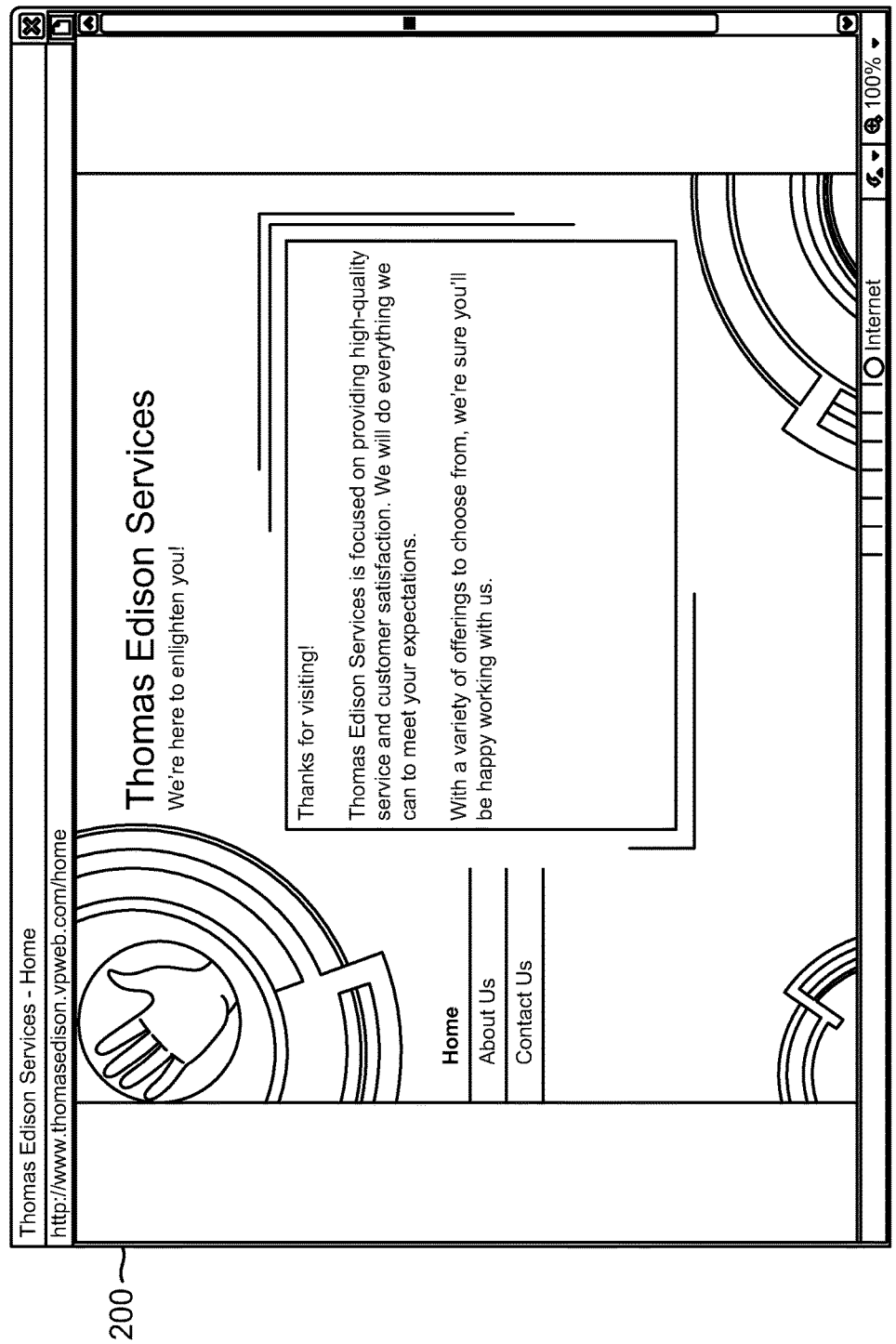
FIG. 5A is an example of a Home Page of a conventional website.
Figure 5B:
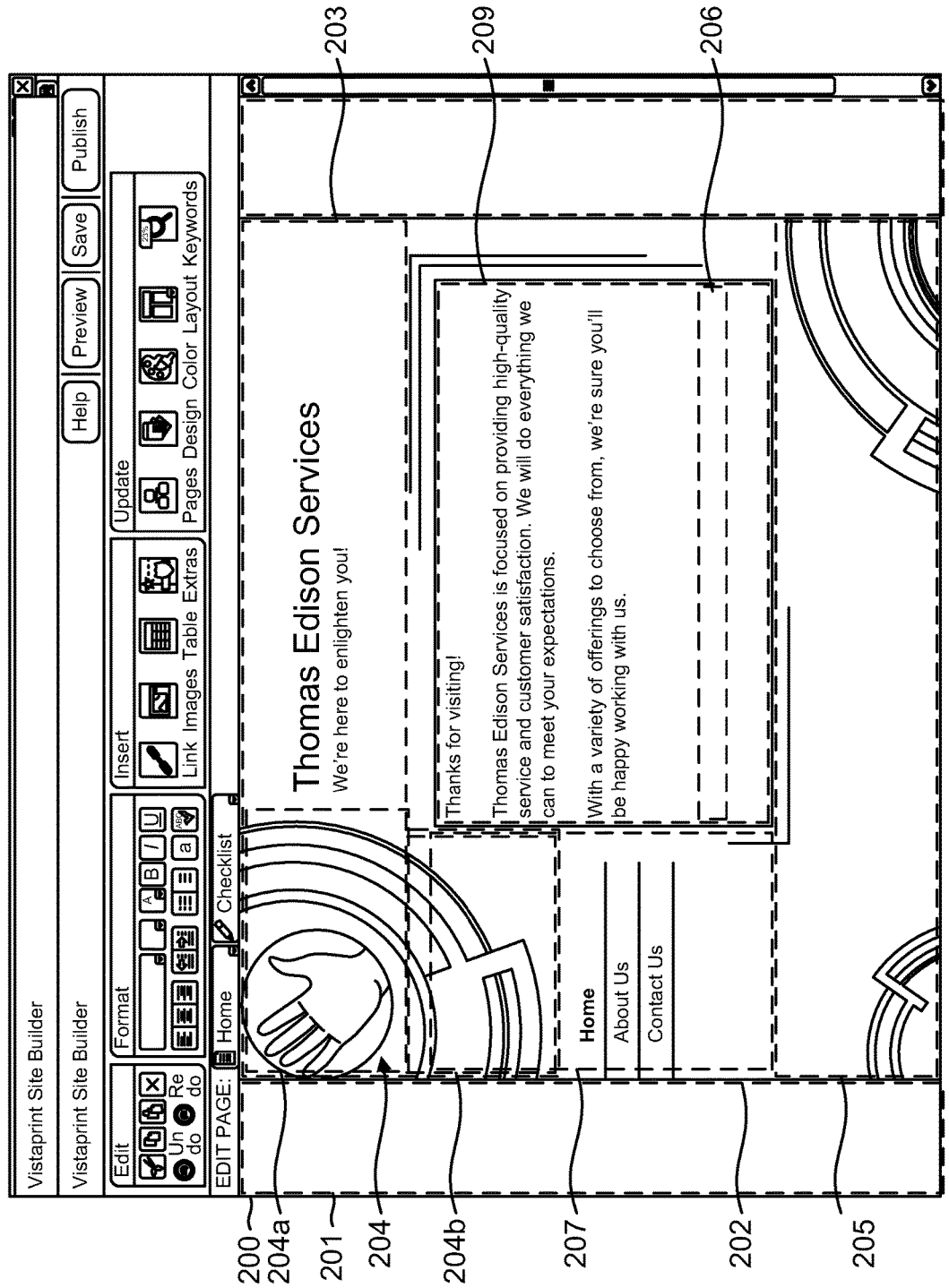
FIG. 5B is an anatomical view of the Home Page of FIG. 5A.

FIGS. 5A-5D exemplify a set of screen shots of various web pages of an example website. FIG. 5A displays a Home page 200 of the example website. FIG. 5B illustrates an embodiment of various components that make up the anatomy of the Home page 200. As illustrated, the Home page 200 includes an outer background 201, an inner background 202, a header 203, a footer 205, a navigation panel 207, a repeatable middle portion 206, and a content area 209. In an embodiment, the user content area 209 may vertically expand and contract to fit the amount of content inserted in the user content area 209. As the user content 209 expands beyond the existing container size (in the vertical direction), one or more instances of the repeatable middle portion 206 are added to page so that the user content area does not expand into the footer 205. Conversely, when the user content 209 is edited to remove content such that the vertical space occupied by the user content allows one or more instances of the repeatable middle portion 206 to be removed from the page while still not resulting in the user content area overlapping the footer 205, then those one or more instances of the repeatable middle portion are removed automatically by the website building tool.

In a www. website, which has more display area than available on mobile devices, portions (e.g., 204*a*) of the artwork 204 (comprising portions 204*a* and 204*b*) (such as a logo or image) in the header may extend vertically into one or more of the inner background 202 or navigation area 207. The header artwork 204 then appears to partially wrap around one or both of the top corners of the user content area 209. The resulting appearance may be such to reduce the "building-block" look of the website, resulting in a more sophisticated appearance which is more aesthetically pleasing to the user.

Figure 5C:
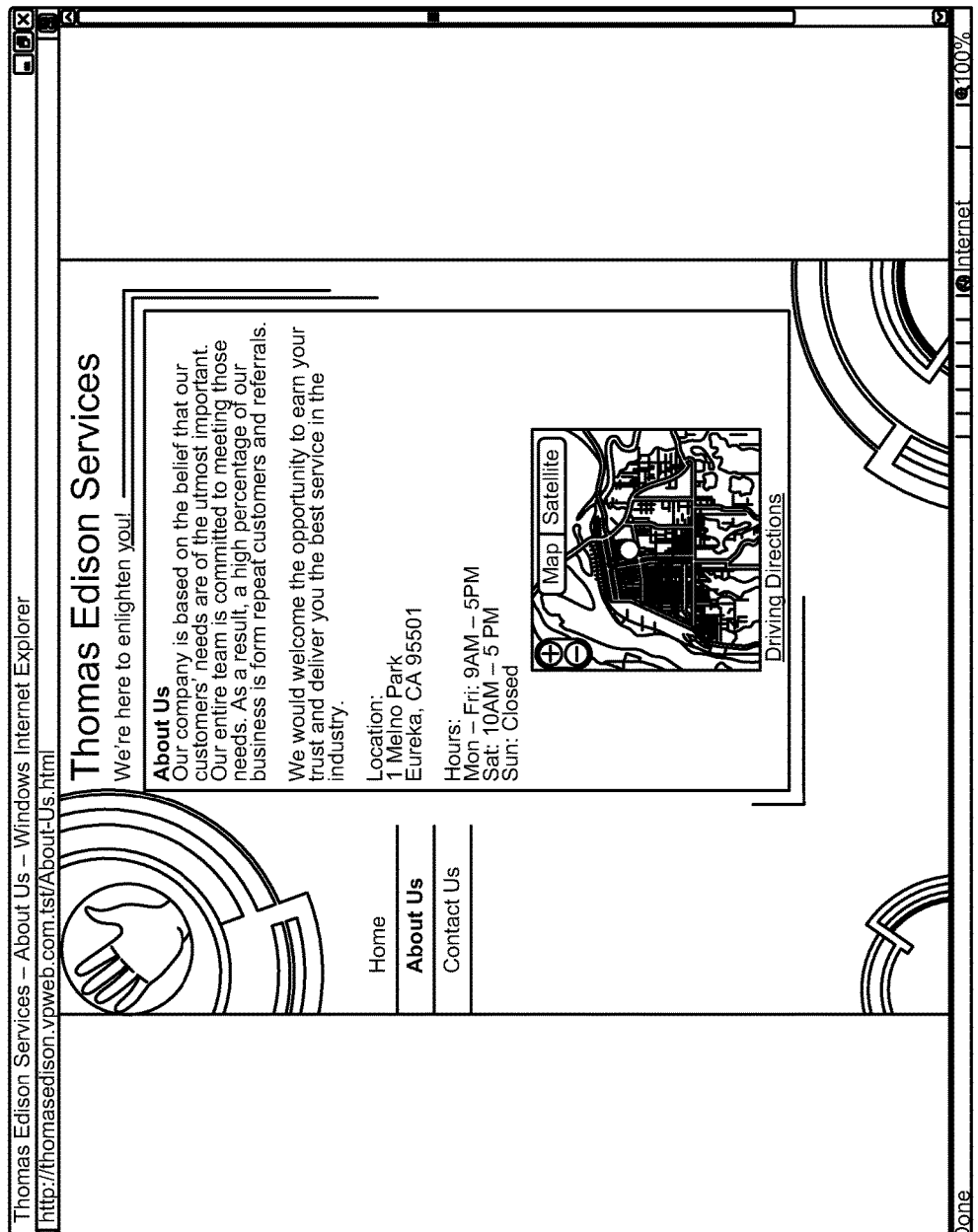
FIG. 5C is an example of an About Us web page of a conventional website.
Figure 5D:
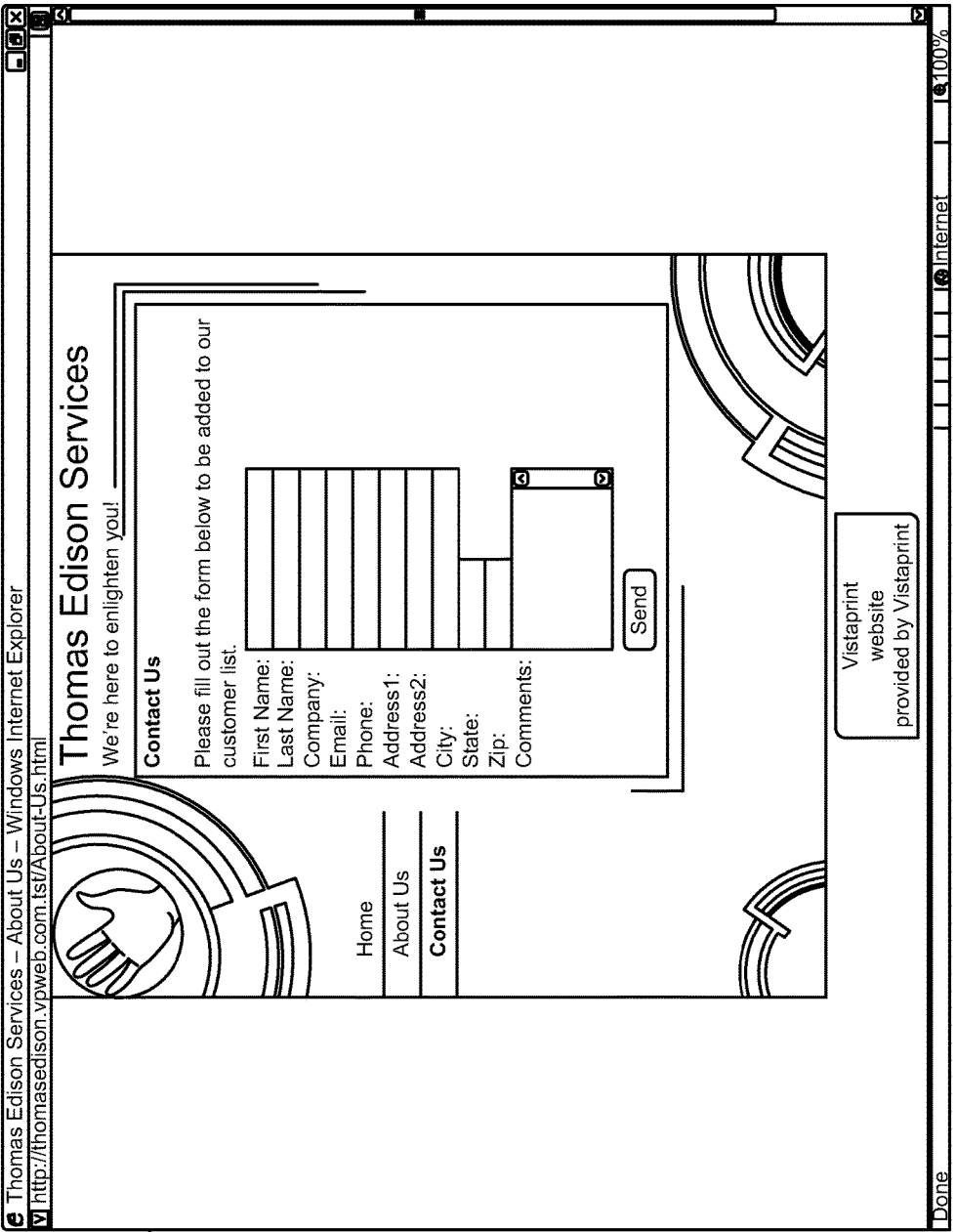
FIG. 5D is an example of a Contacts web page of a conventional website.

FIG. 5C illustrates of an example "About Us" web page 210 and FIG. 5D illustrates an example "Contact" web page 220, both of which are part of the same website as the Home page 200. Notably, all three pages 200, 210, 220 include the same outer background 201, inner background 202, header 203, footer 205, navigation panel 207, and repeatable middle portion 206, while the content displayed in the content area 209 of each page differs. This gives the website a coherent look and feel, and allows each page 200, 210, 220 in the website to be accessed from any other page by way of corresponding links in the navigation panel 207.

Figure 6:
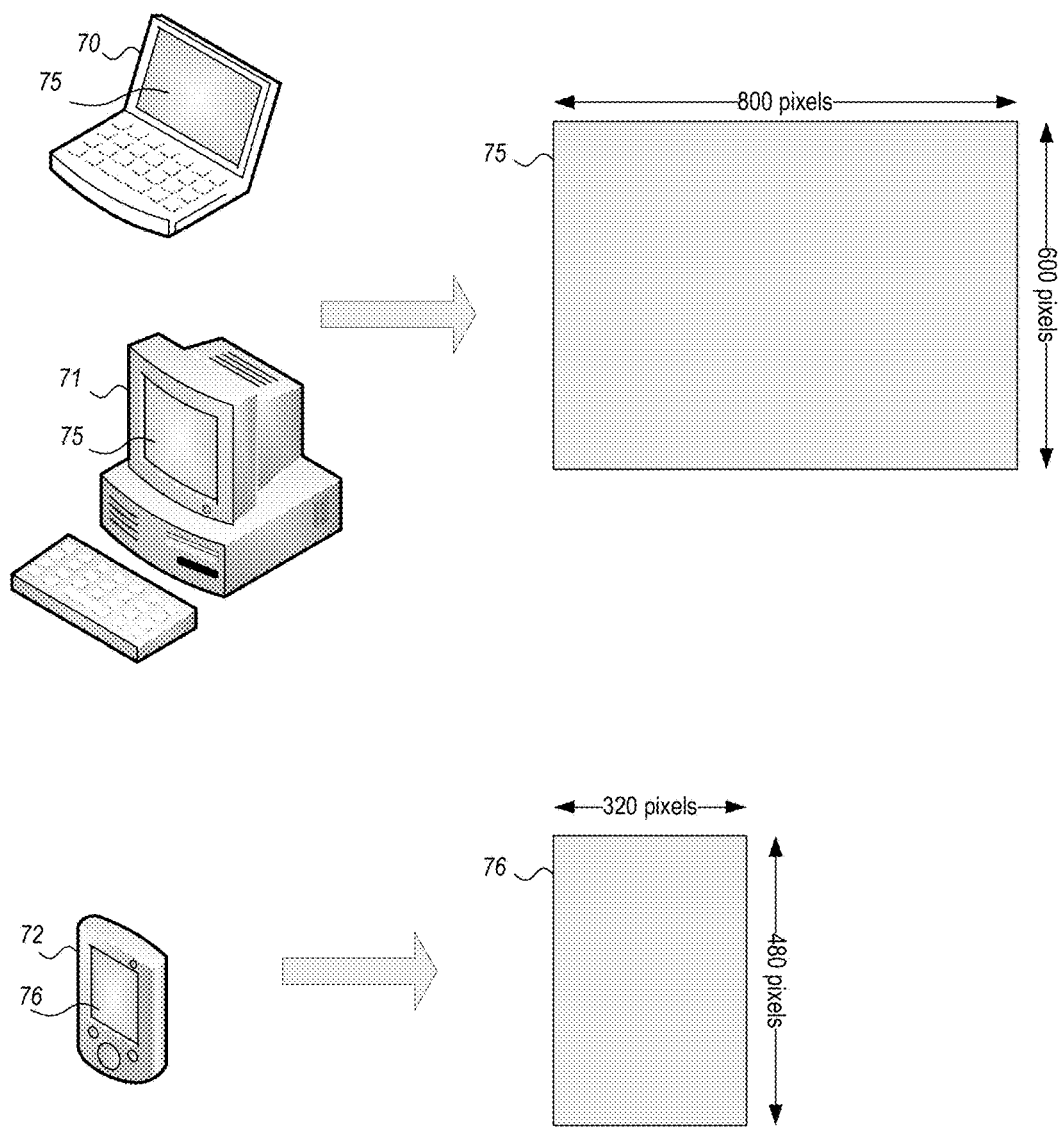
FIG. 6 illustrates the difference in display screen shape, size, and pixel count between a conventional desktop or laptop display and a mobile device display.

As previously mentioned, a conventional (.www) website is typically created for display on a desktop 71 or laptop 70, which is typically wider than it is tall. A typical number of pixels on a conventional desktop or laptop display 75 might be, for example, 800 pixels wide by 600 pixels long. In contrast, the display screen 76 on a typical mobile device 72 is usually longer than it is wide. For example, a typical mobile device might provide 320 pixels width by 480 pixels length. This is illustrated in FIG. 6. In a conventional website, the designer sets the size and content of the header (see 204 in FIG. 5B). The www. header is typically designed to span the width of the conventional laptop or desktop display 75 and is thus greater in width than the width of the typical mobile device (i.e., header 203 is typically greater than 320 pixels wide). Thus, when rendered on a mobile device, either or both sides of the header may appear cut off when rendered on a mobile device. In addition, portions of artwork that appear to be part of the www. header (but are actually implemented as background to another page component such as the navigation panel or inner background), may appear cut off along the bottom edge if the www. header is rendered on a mobile device unless the other component that implements the complementing artwork is also rendered. For example, as previously described in connection with FIG. 5B, a conventional website header that appears to include artwork 204 that extends vertically into the inner background area 202 or navigation area 207 may in fact be implemented as complementary pieces 204*a*, 204*b* in different components (header 202 and navigation area 207) that come together to form a single artwork piece 204 when rendered on a conventional display. However, because the width of the typical mobile device is much smaller than the width on a desktop or laptop display, a website that is optimized for mobile devices might not utilize the navigational area component 207 from the www. website at all, or at the very least might reposition the navigational area component 207, for example to the center of the m. web page. Thus, the complementary portion 204*b* of the artwork 204 would either not be displayed (in the case of not rendering the www. navigational area component 207) or may be offset so that the complementary artwork portion 204*b* does not align with the primary artwork portion 204*a* (in the case of centering or otherwise repositioning the navigational area component 207 with respect to the header component 203). Accordingly, an independent mobile-optimized header is ideally used in place of the www. header 203 when generating a mobile-optimized website.

Figure 7:
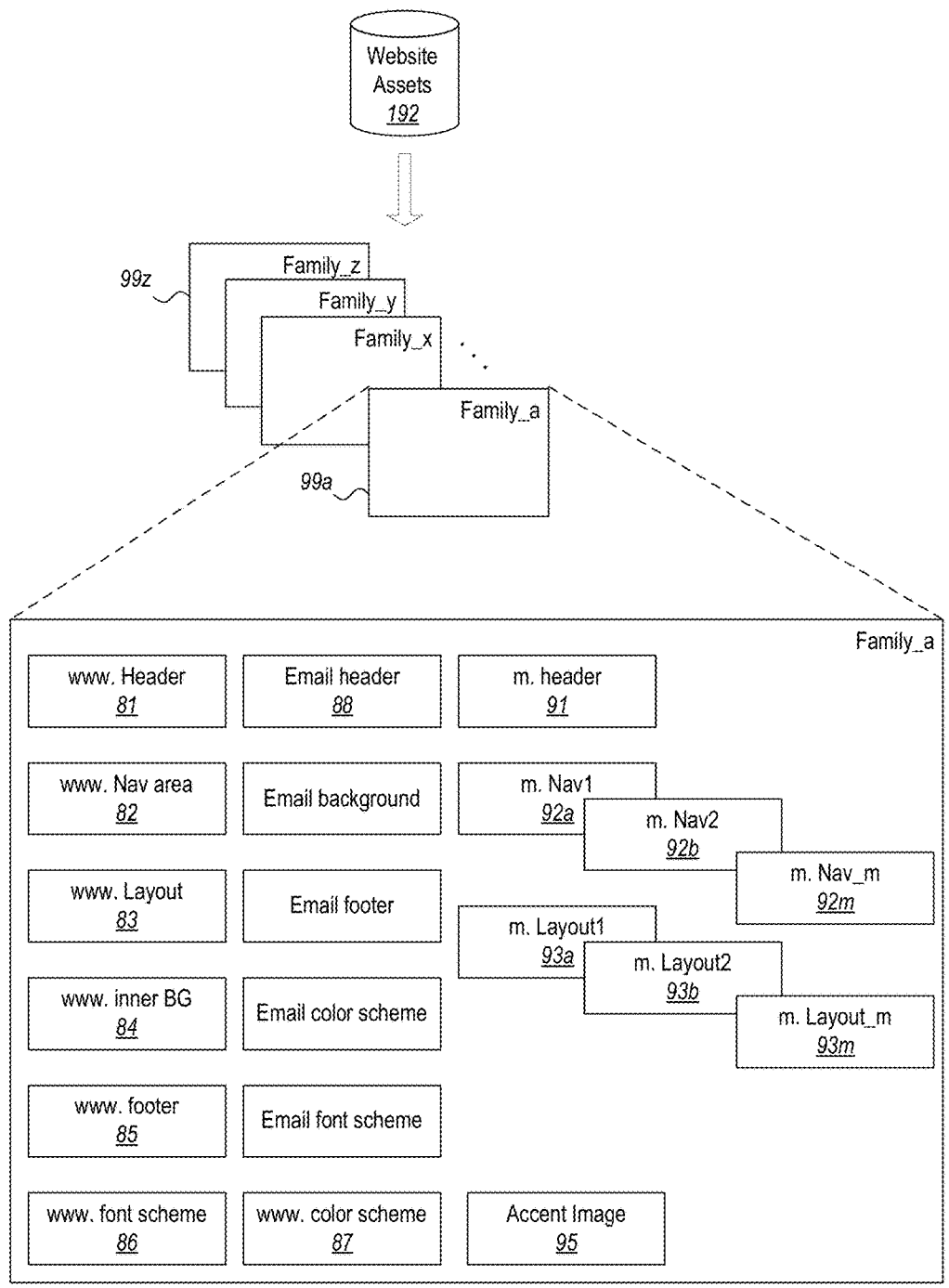
FIG. 7 is a block diagram illustrating an example set of website component assets stored in a website assets database.

FIG. 7 depicts a structural diagram of a portion of a website assets database 192. The website assets database 192 contains components and descriptions such as headers, navigational components, background images, inner background images, footers, layouts, color schemes, accent images, font schemes, template descriptions, and any type of component or scheme that may be used as a component in a web page. A web page may include a plurality of different components arranged (such as layouts, headers, footers, backgrounds, text components, and images) and/or applied (such as color schemes, font schemes, backgrounds, layouts, etc.) according to a page description (typically .html).

In order to allow for computer-automated product matching, such as websites, mobile websites, email marketing campaigns, and printed products such as business cards, postcards, brochures, etc., the assets can be categorized into families of "matching" assets. Matching assets are components that share a common image or look-and-feel such that when different matching assets are used across different type of products (such as websites, mobile website, email marketing and printed products), all of the different types of products appear to have a coordinated look—i.e., they appear to belong to the same set of coordinated products. This may be achieved by using one or more of the same image, color scheme, font scheme, etc., and/or by using multiple different images having a similar theme along with an identical color scheme, font scheme, or other component.

Components that are considered to "match" one another are considered to be in the same "family" of assets. Thus, a designer of a www. website may have designed a www. header 81, www. navigation area 82, a www. layout 83, a www. inner background 84, a www. footer 85, a font scheme 86, and a color scheme 87. In order to generate matching email campaigns, the designer may also have created a matching Email header 88. In order to generate matching designs for business cards, postcards, and brochures, the designer may have generated corresponding matching printed product assets that are used by an automated design generation engine to create matching products.

In one embodiment, families of matching assets also preferably include matching m. webpage assets. For example, when a designer generates website assets for a particular www. design that can be automatically combined by a computer system to generate a web page, the designer may at that time also create a matching m. header 91 that is designed to fit on the display screen of a mobile device. The m. header 91 may further be designed to require less data to download to the mobile device in order to allow the m. web page to load more quickly. One way to achieve less data in the header is to reduce the images used and the resolution of the images.

The m. web page assets may also include one or more navigational panels 92a, 92b, 92m, one or more different layout styles 93a, 93b, 93m, and other m. web page components that may be used in the construction of a matching m. website. Each of the m. components are optimized for mobile by reducing the size (i.e., amount of data) of the component and considering the aspect ratio and pixel count of a mobile device. For example, m. layouts tend not to place navigation areas to the left of the content (as they do in www. web pages) but rather centered above or below the user content area on the screen.

In some instance, the website designer may not have generated a m. header or other corresponding assets. In these instances, alternative techniques for generating m. components that match the www. website as closely as possible are necessitated. The particular path to follow depends in part on what assets are available from the family from which the www. assets belong. For example, there may be a different asset in the same family that, although not designed specifically for a m. website, may be close enough in terms of size (i.e., data size) and dimensions. For example, often a header used in an email marketing message is narrower (such as 300 pixels wide) and is smaller in terms of data. Since the email marketing header 88 is close in width and is less data intensive, the email marketing header 88 could be used as the header in a m. website. In this case, if no m.-specific header asset existed in the family of assets, then the system could choose to use the email marketing header 88 as the header component for the m. website.

Alternatively, for any given family of assets, a representative accent image 95 could be associated with the family 99a. The accent image 95 could be an image that appears in some form or another on all products, both electronic (e.g., websites and email marketing) and printed (e.g., business cards, postcards, brochures, etc.). The accent image 95 could be incorporated by the m. website generation engine 172 into an image container in a generic m. header.

Figure 8:
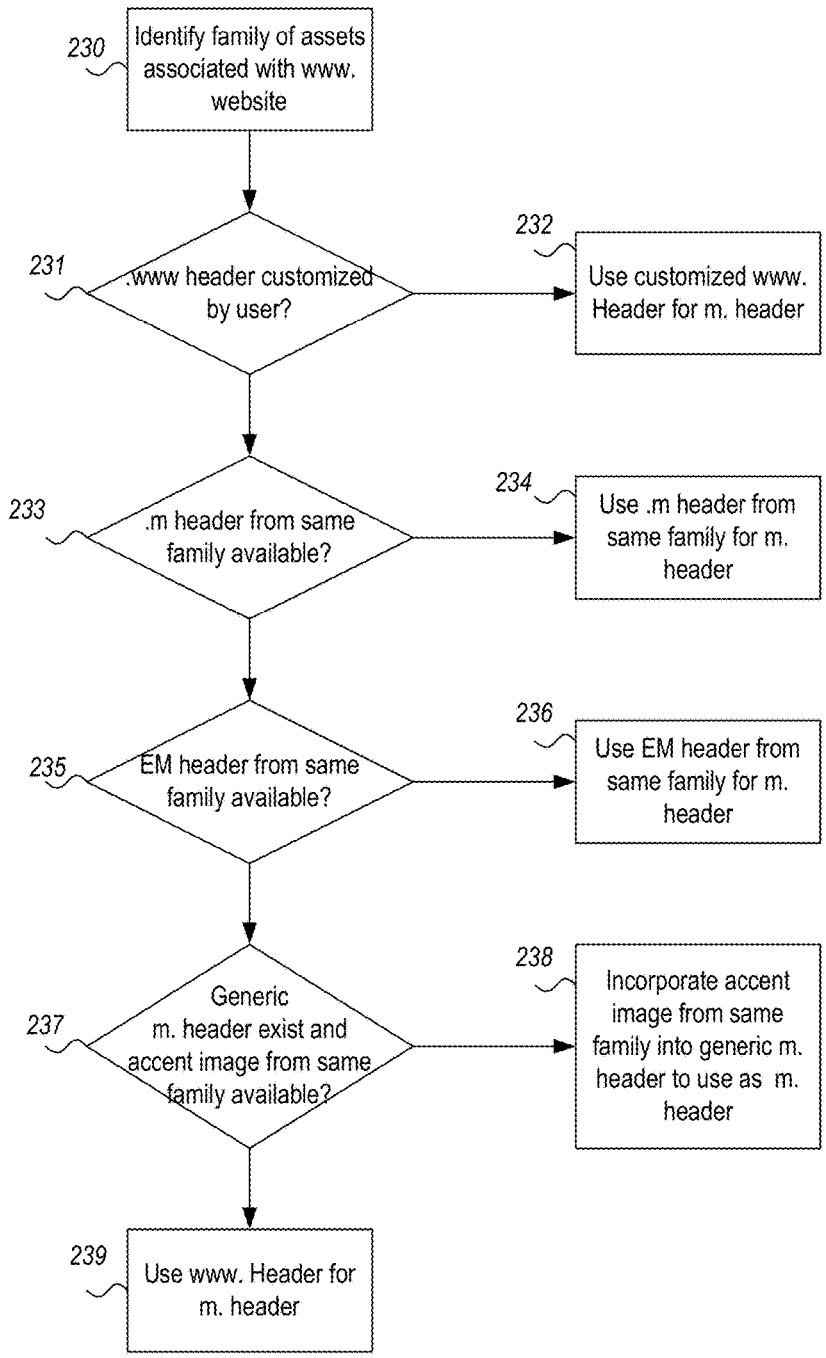
FIG. 8 is an exemplary method for selecting a m. header based on an existing www. website.

FIG. 8 is a flowchart of a method for selecting a m. header based on an existing www. website. As illustrated, given an existing www. website, the matching engine 174 identifies the family of assets from which the www. website is composed (step 230). The matching engine 174 then determines whether the www. header has been customized by the user (step 231)—that is, whether the www. header differs in any way from the standard www. header in the associated family. If so, then the matching engine 174 selects the customized www. header for the m. website (step 232). If not, then the matching engine 174 determines whether a m. header belonging to the same family as the www. website exists (step 233), and if so, selects the m. header from the corresponding family as the m. header for the m. website (step 234). If no m. header from the same family exists (step 235), then the matching engine 174 determines whether an Email Marketing header from the same family exists, and if so, selects the Email Marketing header for the m. website (step 236). If not, then if a generic m. header exists with an image placeholder and an accent image associated with the same family exists (step 237), the matching engine 174 selects the generic m. header and the accent image associated with the family from which the www. website assets belong, and incorporates the accent image into the image placeholder of the generic m. header to use as the m. header in the m. website (step 238). Otherwise, the www. header is used as the m. header (step 239).

In an embodiment, the mobile website generation engine 172 requests matching m. web page components from the mobile website matching engine 174, which identifies one or more families of website assets from which the www. components come from. The mobile website matching engine 174 selects a family that preferably best represents the matching components of the www. website and returns the family identifier to the mobile website generation engine 172. The mobile website generation engine 172 then pulls the appropriate m. website assets from the website assets database 192 and combines them into a corresponding "matching" mobile-optimized website.

In addition to automatically selecting m. website components, preferably matching when available, the mobile website generation engine 172 also generates a set of colors for use in the m. website based on a subset of colors in the www. website. As part of rendering the mobile web page, it is desirable that the colors of the m. website matches the colors of the www. website as closely as possible. While the website assets typically include some pre-defined color schemes, including pre-defined colors for the header, background, text, buttons, and button text, the number of pre-defined colors in a given color scheme is often not enough for all the colors needed to make a mobile website look good. For example, additional colors may need to be generated or determined for the following components and states:

Background light gradient color
Background dark gradient color
Button light gradient color
Button dark gradient color
Button hover light gradient color
Button hover dark gradient color
Button pressed light gradient color
Button pressed dark gradient color
Page text shadowing color
Button text shadowing color
Button border color Because of the limited number of pre-defined colors in a given color scheme, the mobile website generation engine 172 uses the limited number of colors in the color scheme (e.g., the original 5 colors corresponding to the Header color, background, text color, button color, and button text color, as provided by the matching engine 174, or directly by the customer, if they use the advanced color options), to generate, on-the-fly, all the above colors needed to render the page.

Below is an exemplary method for generating additional colors and color gradients given a limited set of "matching" colors from the www. website or as selected from the matching engine 174. In particular, the color generation engine 175 performs the following steps:

For all gradients
   If the brightness of the color is >0.3 (on a scale of 0 to 1)
      Subtract a delta from the color value (where the color value ranges from 0 to 255).
      Put the light color on top and dark on bottom
   If brightness of color is <0.3 (on a scale of 0 to 1)
      Add a delta to the color value (where the color value ranges from 0 to 255).
      Put light color on top, and dark on bottom
For all shadows:
   Subtract a delta from the base color value (to make it darker)

Limit the color to black, and never make brighter than the original color

The delta for the gradients is dependent on where it's being used. For example, in an embodiment, the background delta is 15, and the button delta is 10. Other delta values may be selected to achieve different gradients and shadow effects.

Once the resulting list of colors is generated, color generation code generates a CSS file (a website's cascading stylesheet) and associates the CSS file with the m. website to be used by the mobile website that defines all the colors used in the site.

Using the color generation engine 175, mobile websites can be automatically configured with "matching" colors, color gradients and color shadows for components included in the m. website that are not present in the original www. website.

Figures 9A, 9B:
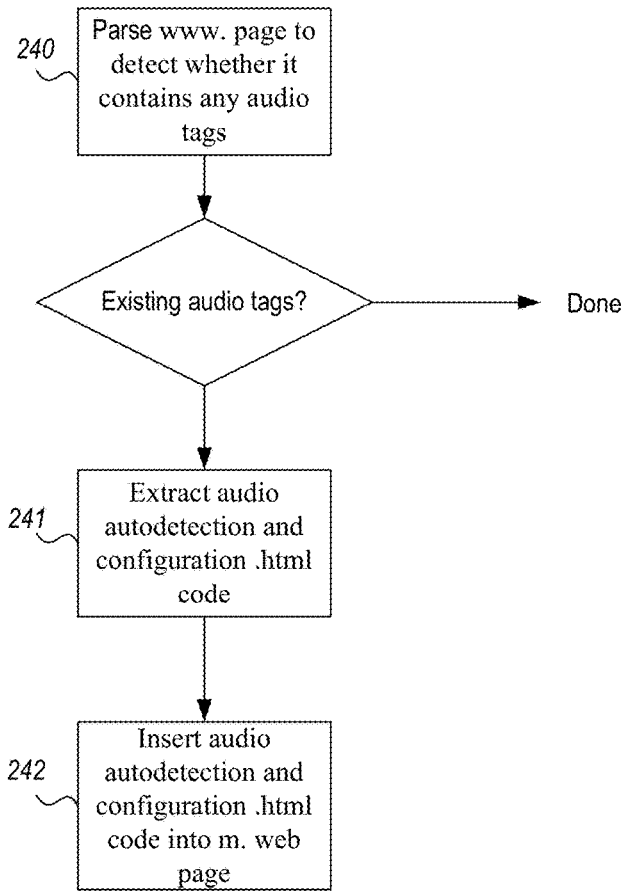
FIG. 9A is a flowchart illustrating an exemplary method for automatically configuring a mobile-optimized web page to select and configure an audio player on a mobile device.
FIG. 9B is a flowchart illustrating an exemplary operation of the audio autodetection and configuration description when encountered in a mobile-optimized web page by a browser.

In addition to automatically selecting m. website components, preferably matching when available, the mobile website generation engine 172 also parses the content of each www. web page to determine whether it has audio components or tags incorporated into the page. If so, the mobile website generation engine 172 adds .html code to automatically detect the browser and/or mobile device type and to select and configure the correct audio player to work on the mobile device that requested the page. FIG. 9A is a flowchart illustrating an exemplary method for automatically configuring a m. web page to select and configure an audio player on a mobile device so that audio tags embedded in a m. web page automatically play using the correct audio player for the particular mobile device. As illustrated, the mobile website generation engine 172 parses the www. page to detect whether it contains any audio tags (step 240). If not, the corresponding m. web page does not require optimization for audio and the method is complete. If the www. web page contains any audio tags, however, the mobile website generation engine 172 extracts from a website assets database 192 special .html code for automatically detecting the browser/device and selecting and configuring the correct audio player to play audio files (step 241). The audio autodetection and configuration .html code is then inserted into the m. web page (step 242).

FIG. 9B is a flowchart illustrating the operation of the audio autodetection and configuration .html code when encountered in a m. web page by a browser 105. As illustrated, the audio autodetection and configuration .html code implements functionality for determining the browser and/or device type of the mobile device (step 243). Each browser has an associated user agent string that identifies the browser type, mobile device type, etc. In an embodiment, the mobile website generation engine 172 generates a user agent string query to get the user agent string, and then extracts the browser type and/or device type. Often, although not in all cases, the mobile device type can be inferred from the browser type. For example, if the browser type is an Android browser, then one can infer that the mobile device is an Android device. Different models of a particular device may use different versions of browsers and provide different functionality. Therefore, it can be important to ascertain not only the browser type and/or device type, but also the version number of the browser and/or model number of the device type.

Given the browser type (and preferably version number) and/or device type (and preferably model number), the audio autodetection and configuration .html code implements functionality for automatically selecting and executing the proper .html code that configures the audio player specific to the mobile device to make the audio player operate correctly (step 244).

Below is an example JavaScript code snippet which checks whether the mobile device is a GOOGLE ANDROID device, and if so, follows GOOGLE ANDROID device-specific configuration code to display and play audio files. Then, if the mobile device is not a GOOGLE ANDROID device, the code checks to see if the mobile device is an APPLE IPHONE device and follows APPLE IPHONE device-specific configuration code if the mobile device is in fact an APPLE IPHONE device. If the mobile device is not identified as either a GOOGLE ANDROID device or an APPLE IPHONE device, the code defaults to configuring an ADOBE FLASH audio player for playing audio files.

Audio Autodetection and Configuration Code (written in JavaScript):

```
var createMobileAudioByDevice = function ( )
{
  var audioPlayers = $(".audio-player");
  if (audioPlayers.length > 0)
  {
    $.each(audioPlayers, function (i, element)
    {
      var linkHref = $(element).find("a").attr("href");
      var playerId = $(element).attr("id") + "_player";
      var player;
      if (navigator.userAgent.indexOf("Mobile") >= 0 &&
        navigator.userAgent.indexOf("Safari") >= 0)
      {
        player = $("<audio></audio>")
            .attr("id", playerId)
            .attr("controls", "")
            .attr("preload", "auto")
            .attr("autobuffer", "");
        player.append(
            $("<source></source>").attr("src", linkHref)
        );
        $(element).html(player);
      }
      else if (navigator.userAgent.indexOf("Android") >= 0)
      {
        player = $("<audio></audio>")
            .attr("id", playerId)
            .attr("src", linkHref)
            .attr("class", "audio")
            .attr("audio", "true")
            .attr("controls", "")
            .attr("width", "95%");
        $(element).html(player);
      }
      else
      {
        inlineContentLoad(AUDIO_PLAYER_JAVASCRIPT,
        function ( )
        {
          AudioPlayer.setup(AUDIO_PLAYER_FLASH, {width:
"95%", transparentpagebg: "yes" });
          AudioPlayer.embed($(element).attr("id"), { 'soundFile':
linkHref});
        });
      }
    });
  }
};
```

In an embodiment, the mobile website URL is "m.domain.com", where "domain.com" is the domain name of the user's website. In a preferred embodiment, however, the mobile site URL does not need to be known or remembered by visitors accessing the website because the server automatically detects when a www. website is being accessed by a mobile device and automatically redirects to the mobile optimized m. website.

Mobile Website Configuration and User Interface

Embodiments of the invention may include a graphical user interface that enables a user to configure, manage, and edit the content and look-and-feel of the optimized matching mobile website that is automatically created by the system. The graphical user interface includes user input controls that allow the user to select and edit the automatically selected options to create a different look-and-feel of the m. website. In an embodiment, the graphical user interface includes a header configuration section which includes controls to allow the user to view and select additional options for headers as well as the automatically-selected matching header. In a preferred embodiment, the graphical user interface includes a fully-editable studio experience for editing headers. In an embodiment, the graphical user interface also includes a layout configuration section which includes controls to allow the user to view and select various different layouts for a given m. web page. Similarly, the graphical user interface includes configuration sections for selecting different options for colors and for editing content on the m. web page. The graphical user interface also allows a user to add widgets (e.g., social media icons/functionality, maps, hours, etc.) which are automatically configured for mobile sites.

Figure 10A:
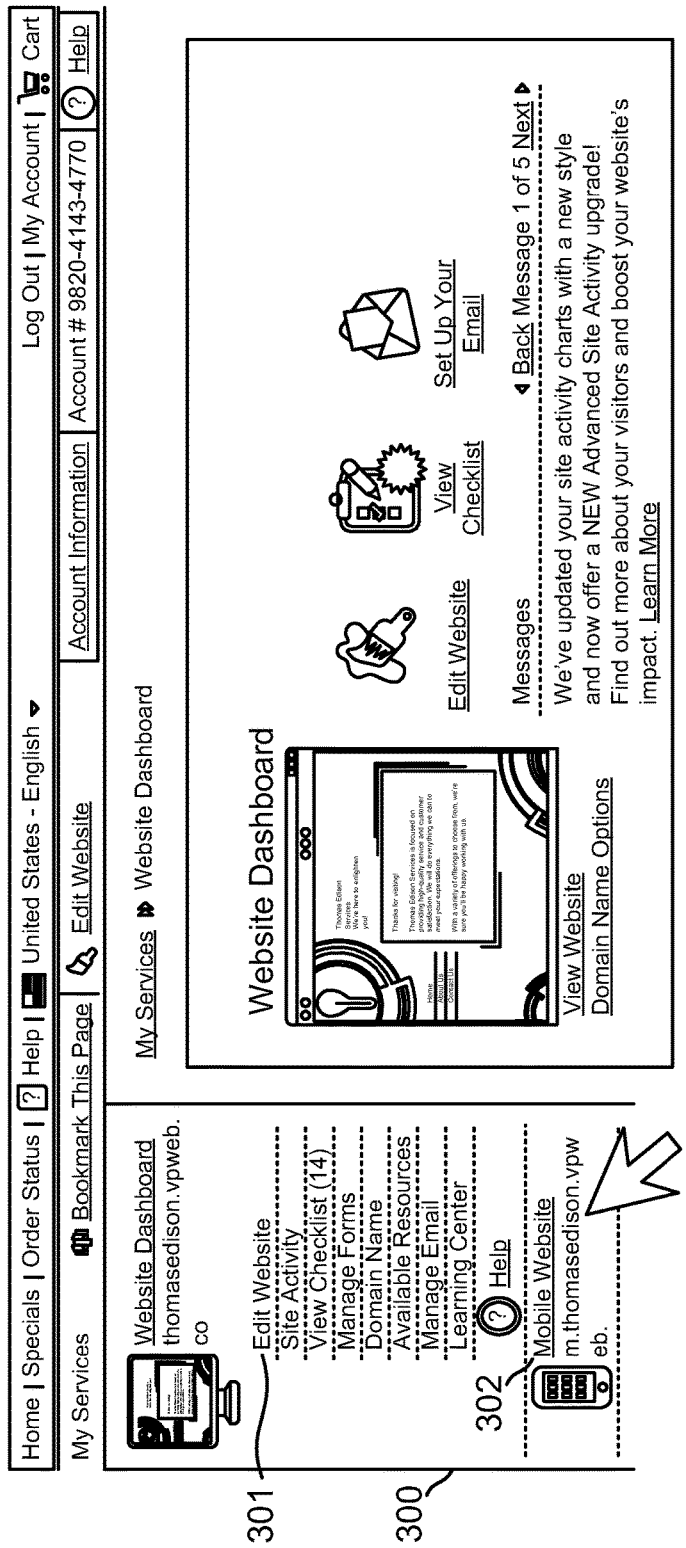
FIGS. 10A-10O illustrate a set of exemplary web pages that are displayed as a user configures and manages a mobile version of a website.
Figure 10B:
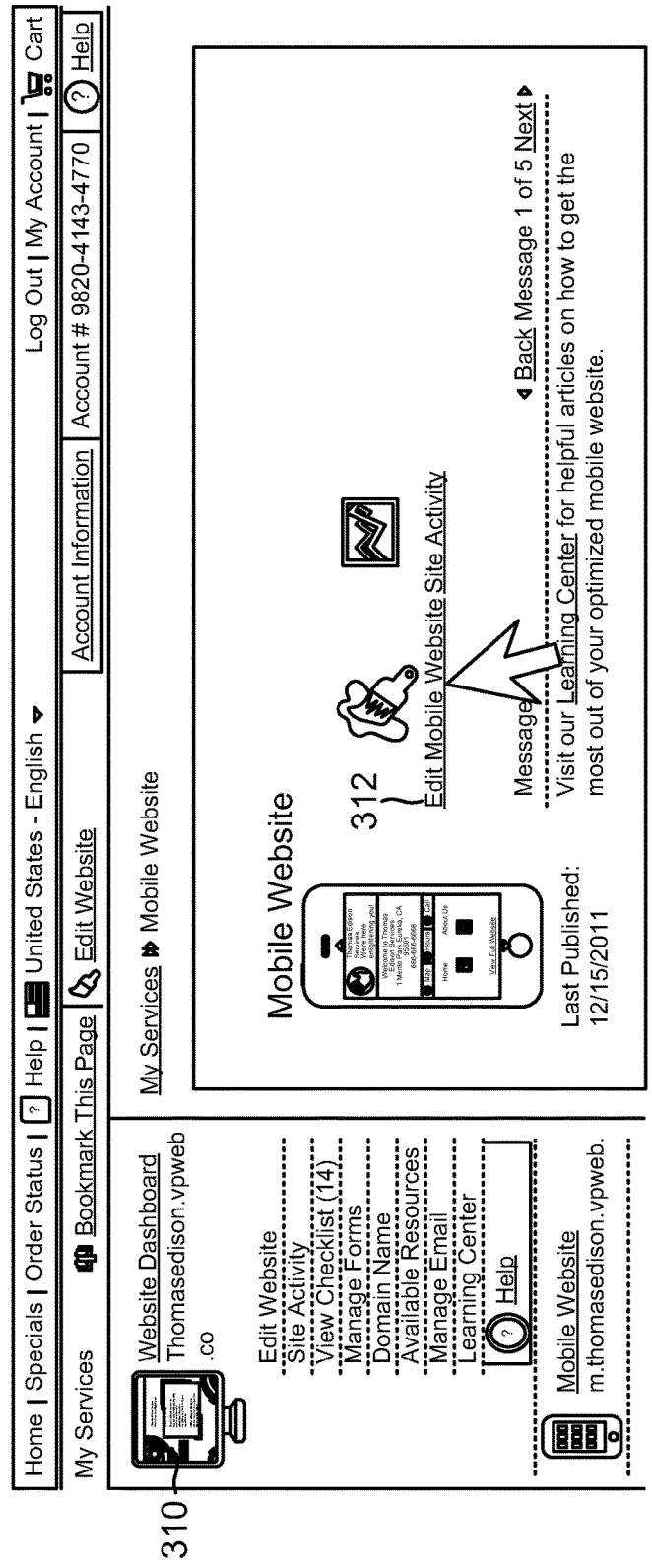
Figure 10C:
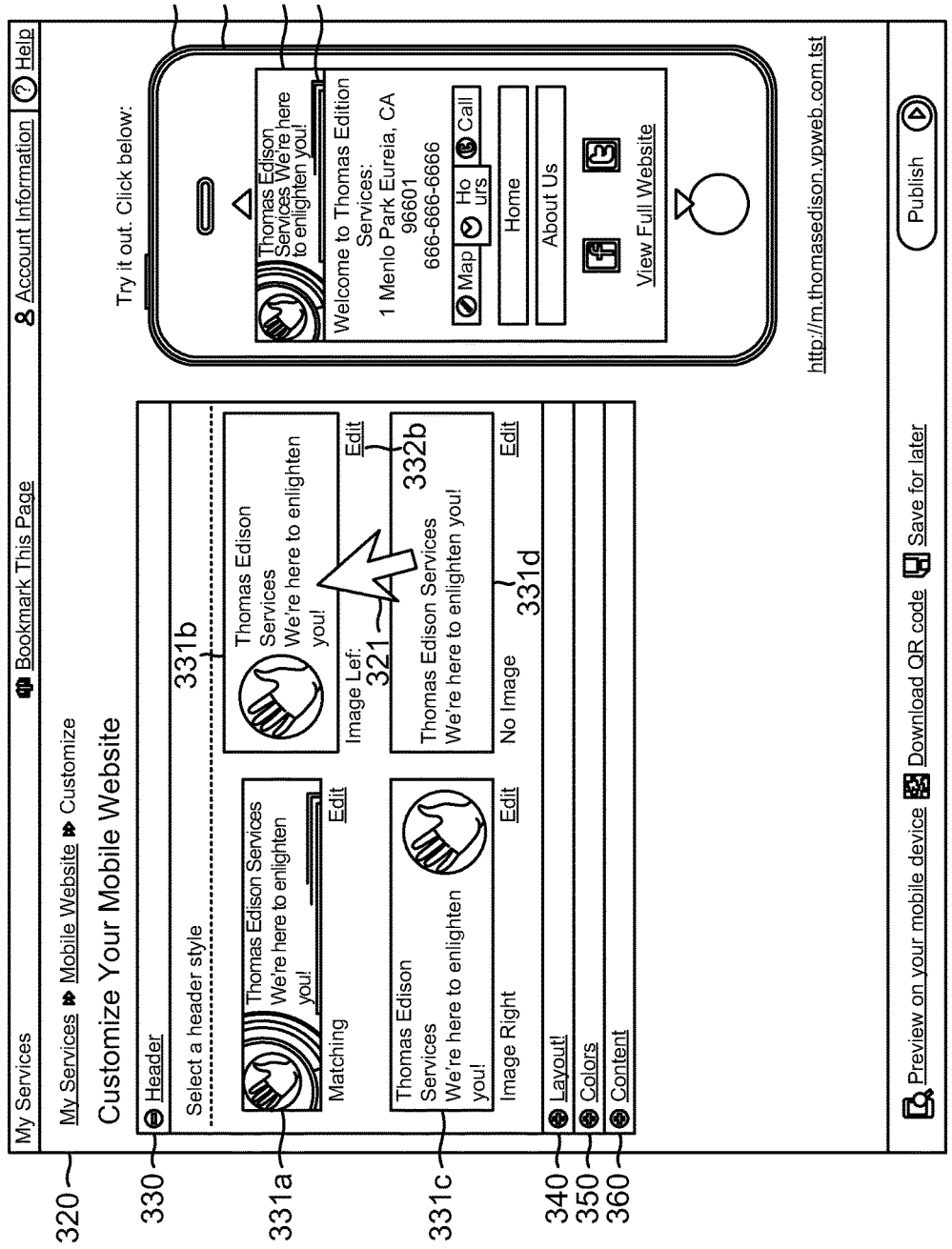
Figure 10D:
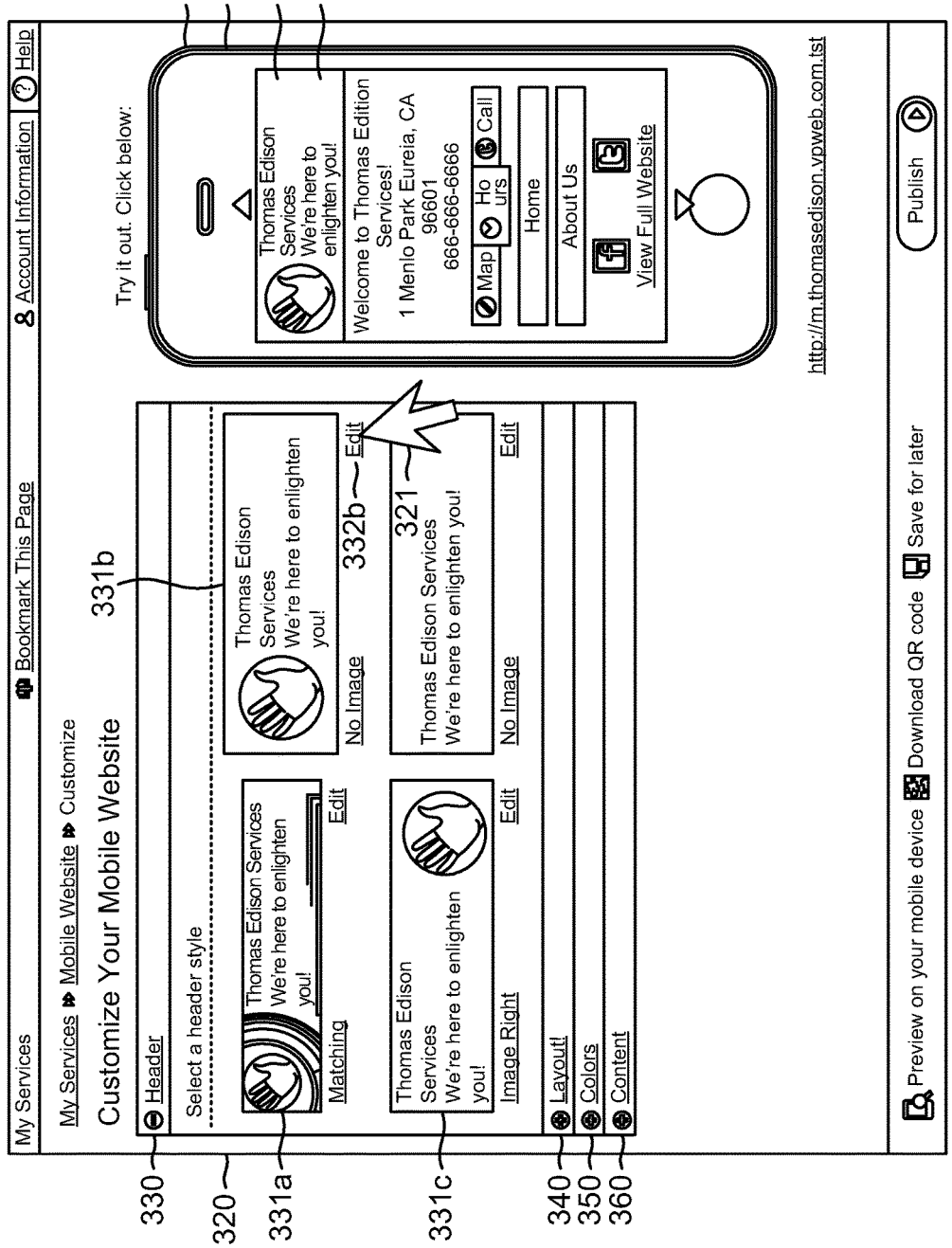
Figure 10E:
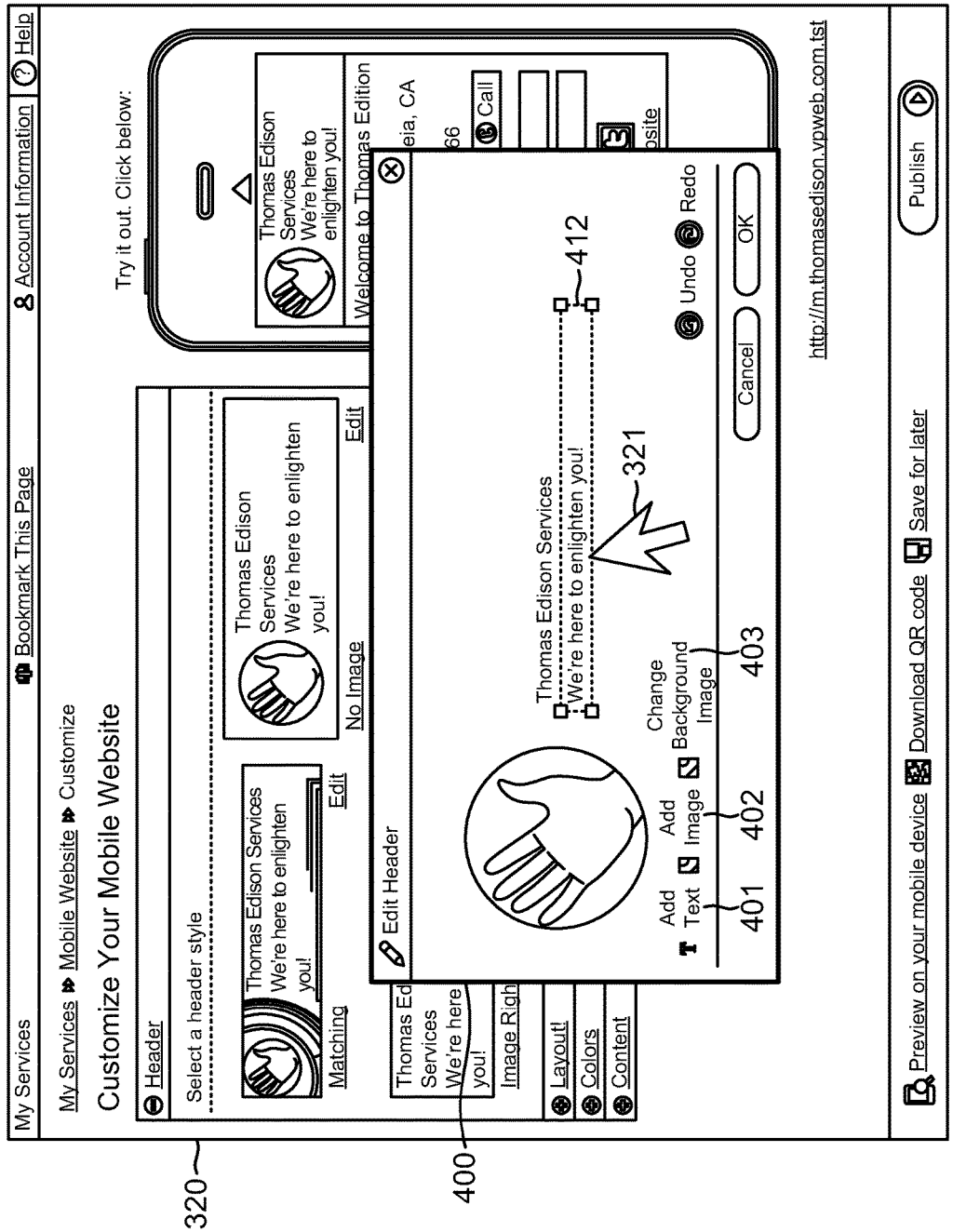
Figure 10F:
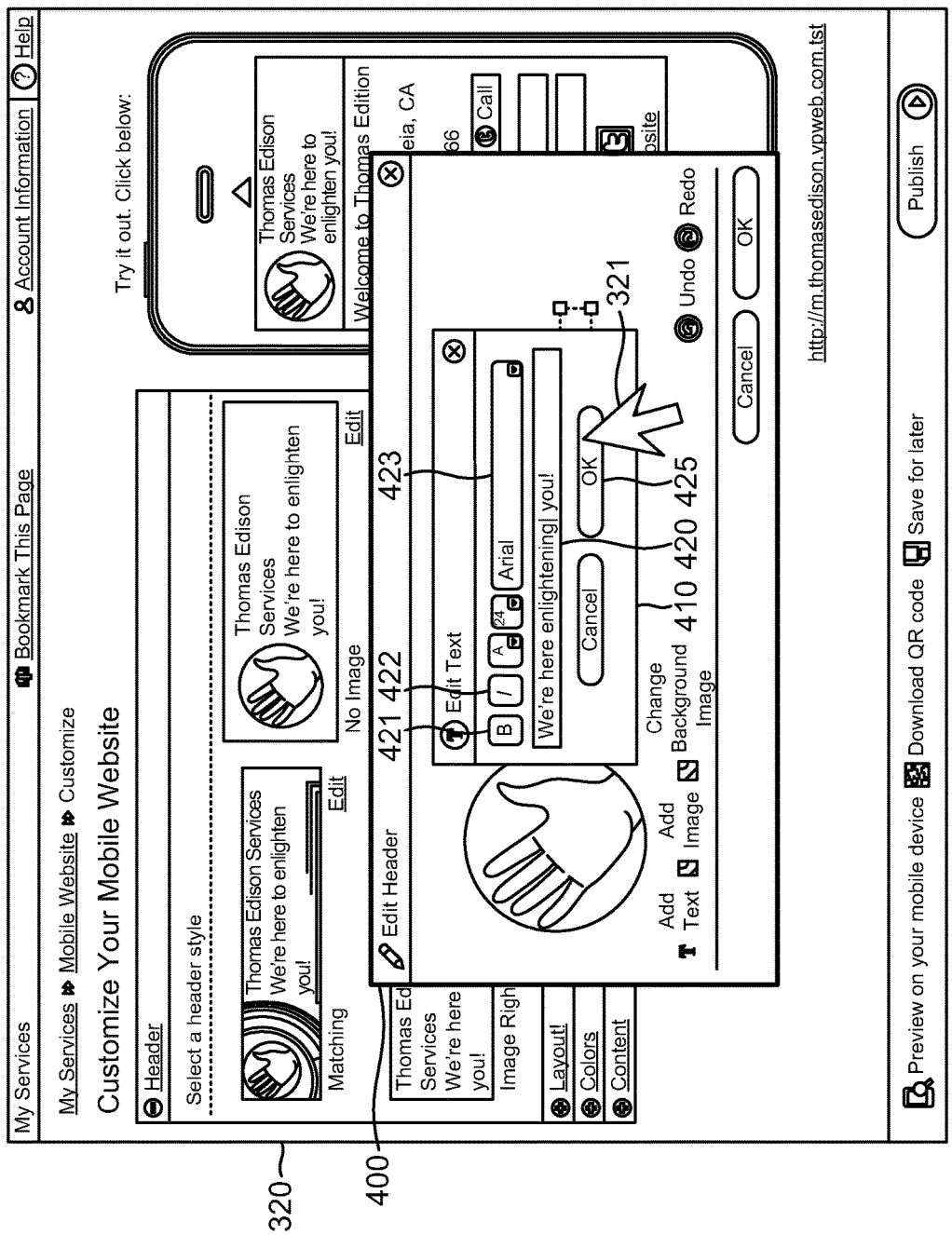
Figure 10G:
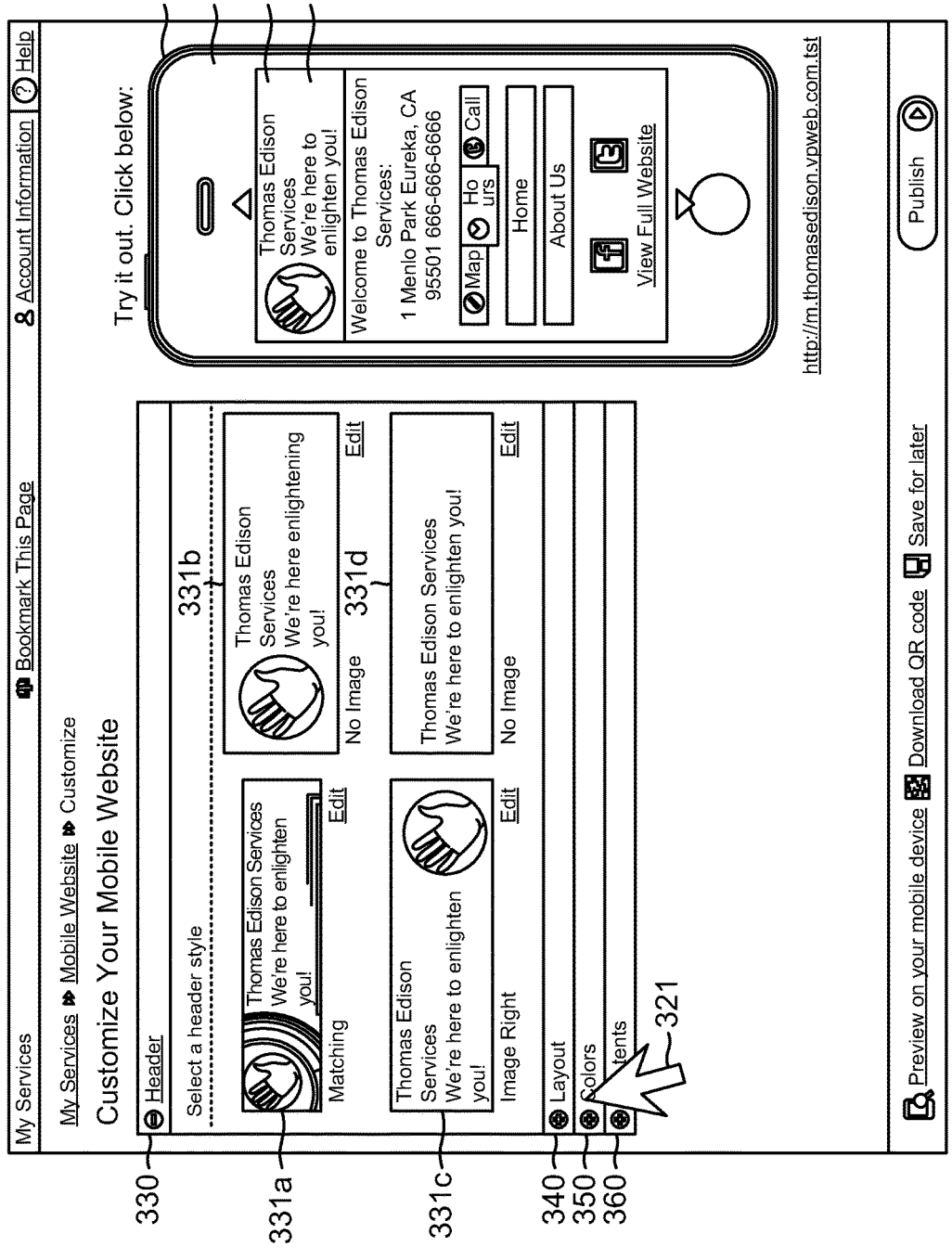
Figure 10H:
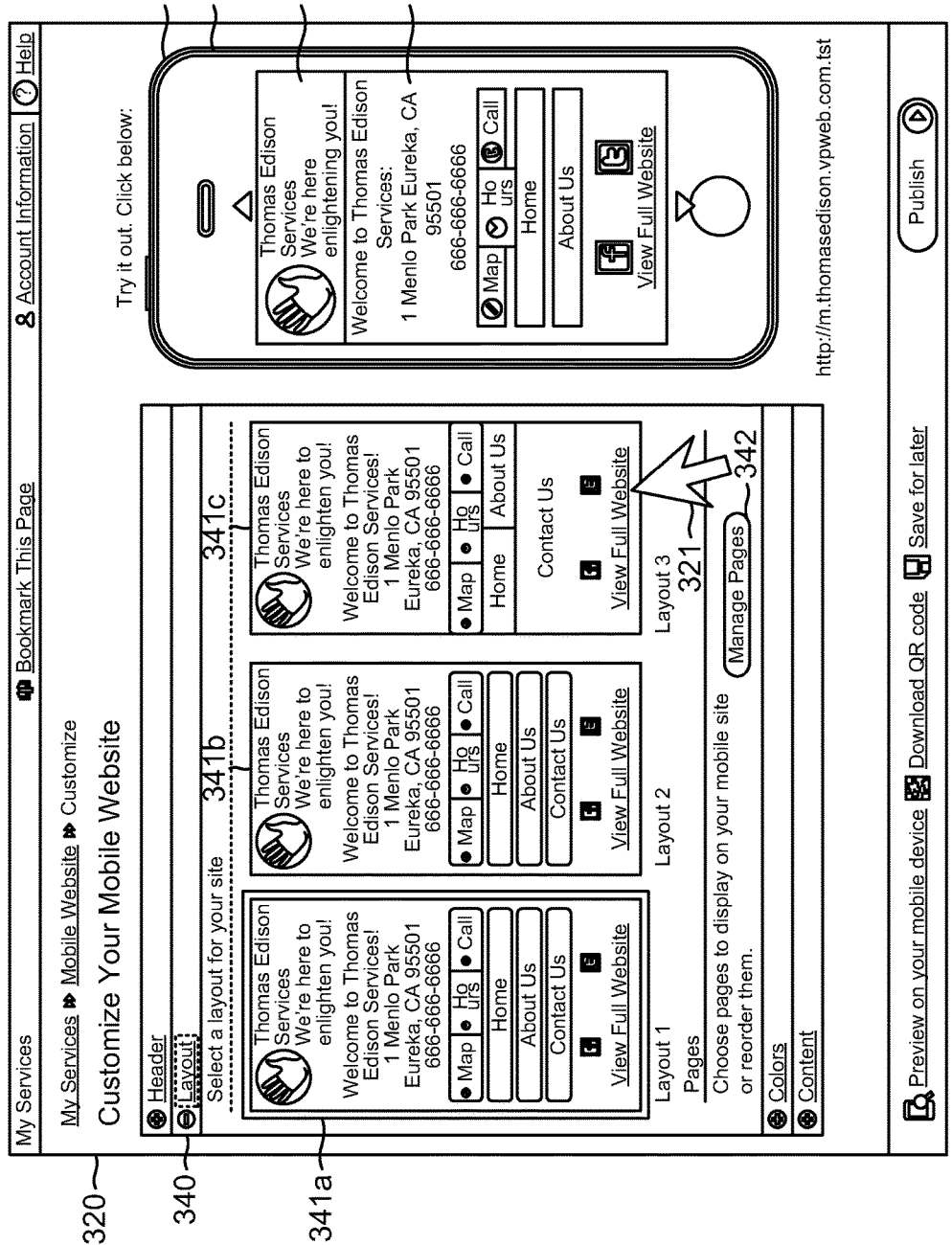
Figure 10I:
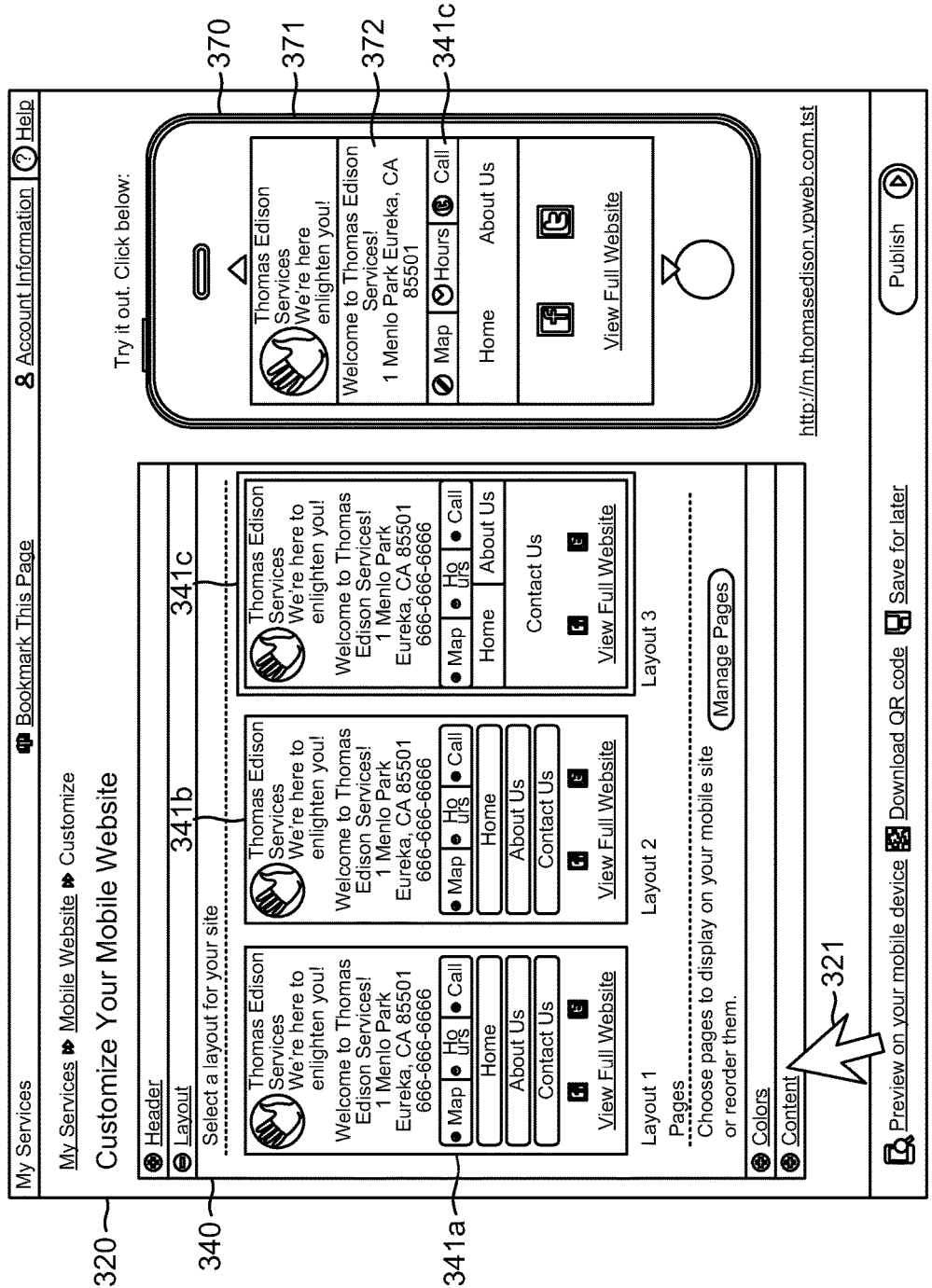
Figure 10J:
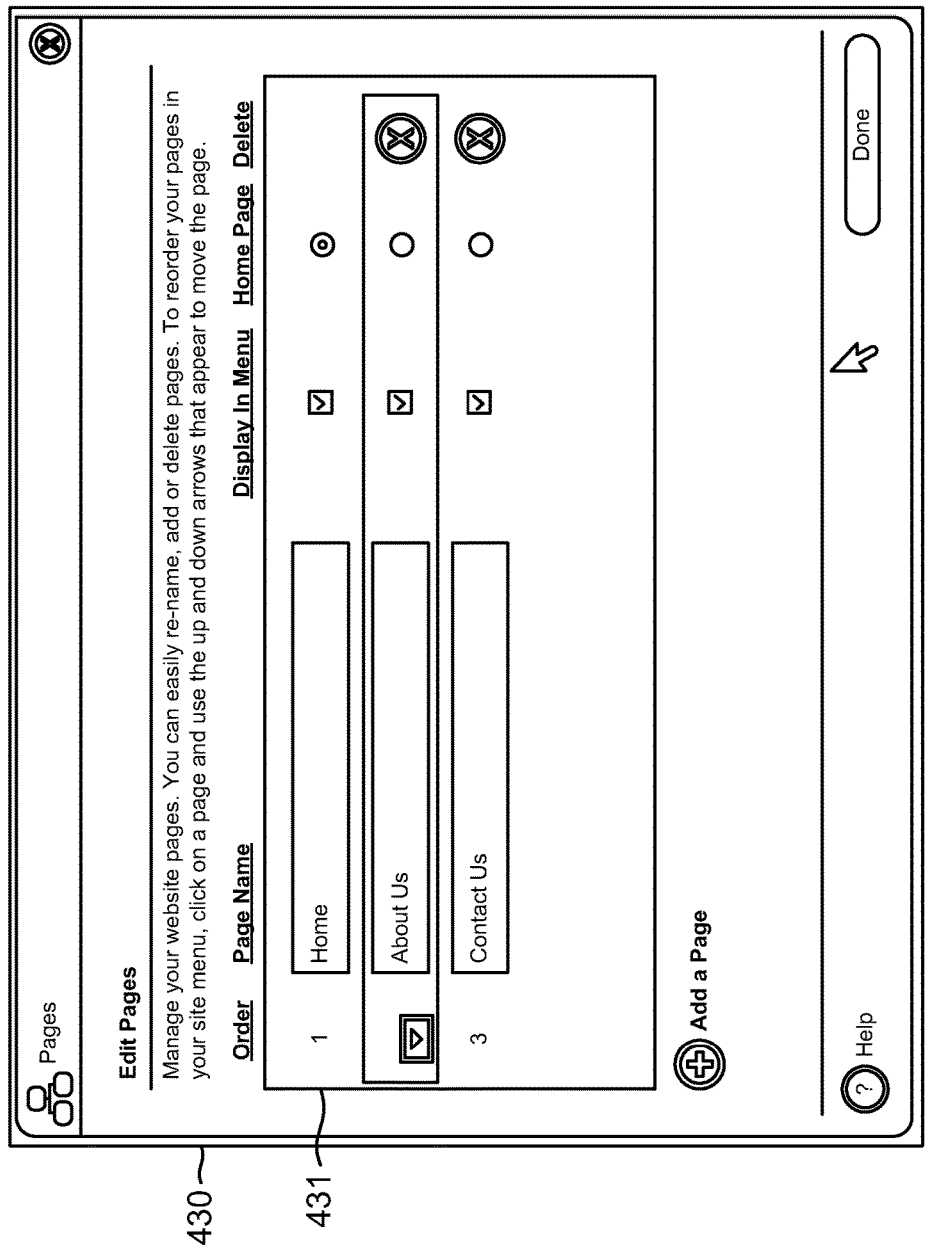
Figure 10K:
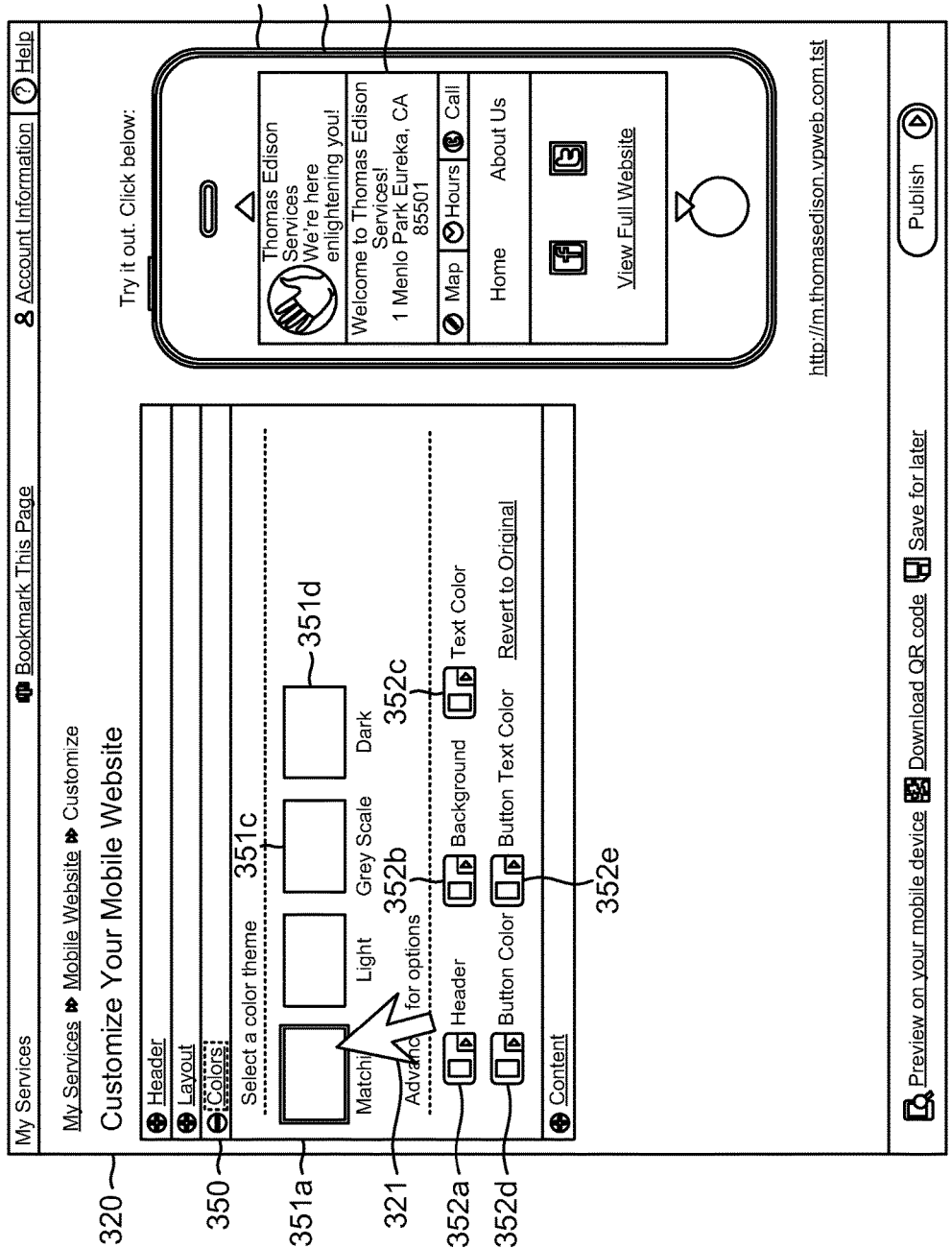
Figure 10L:
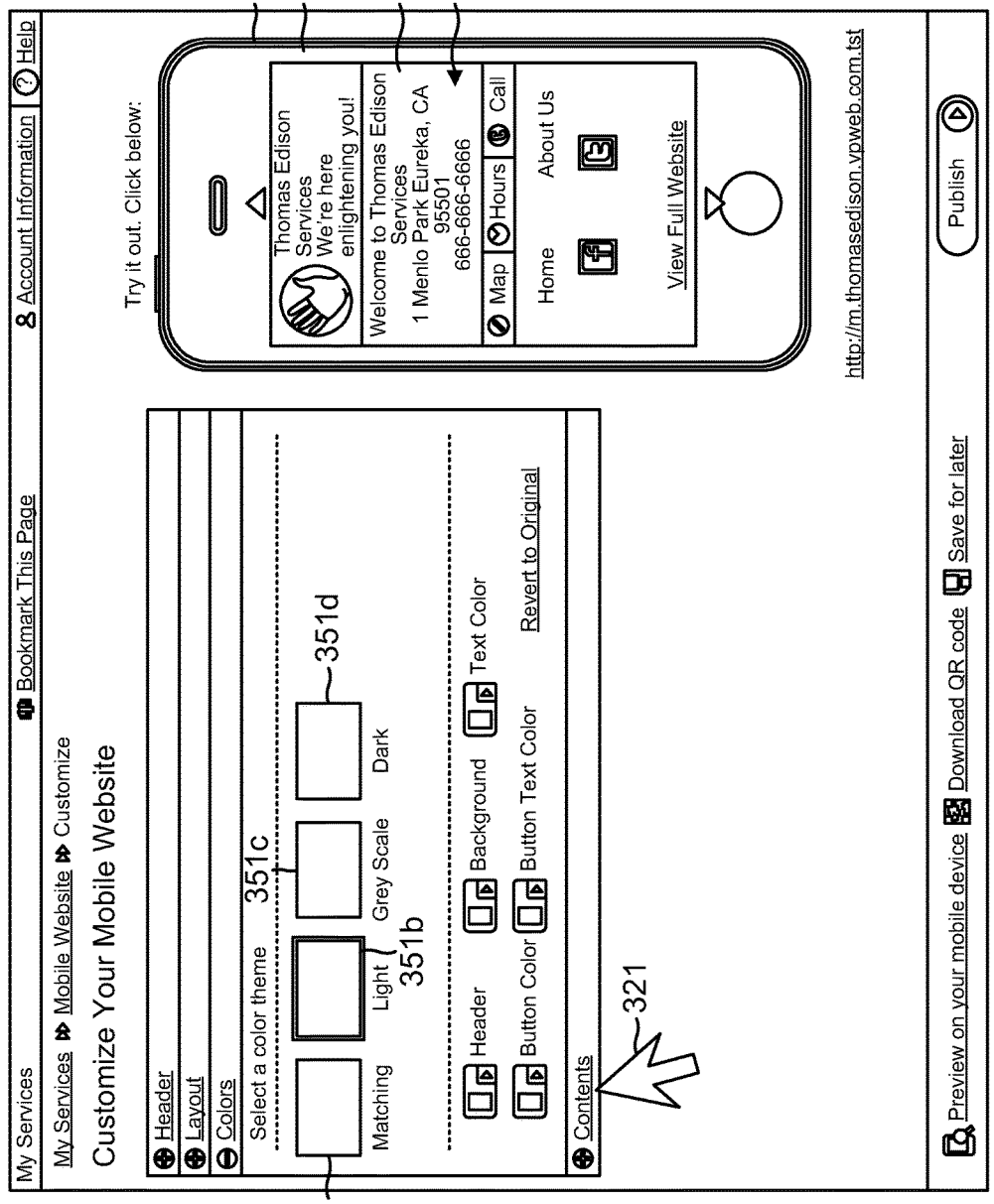
Figure 10M:
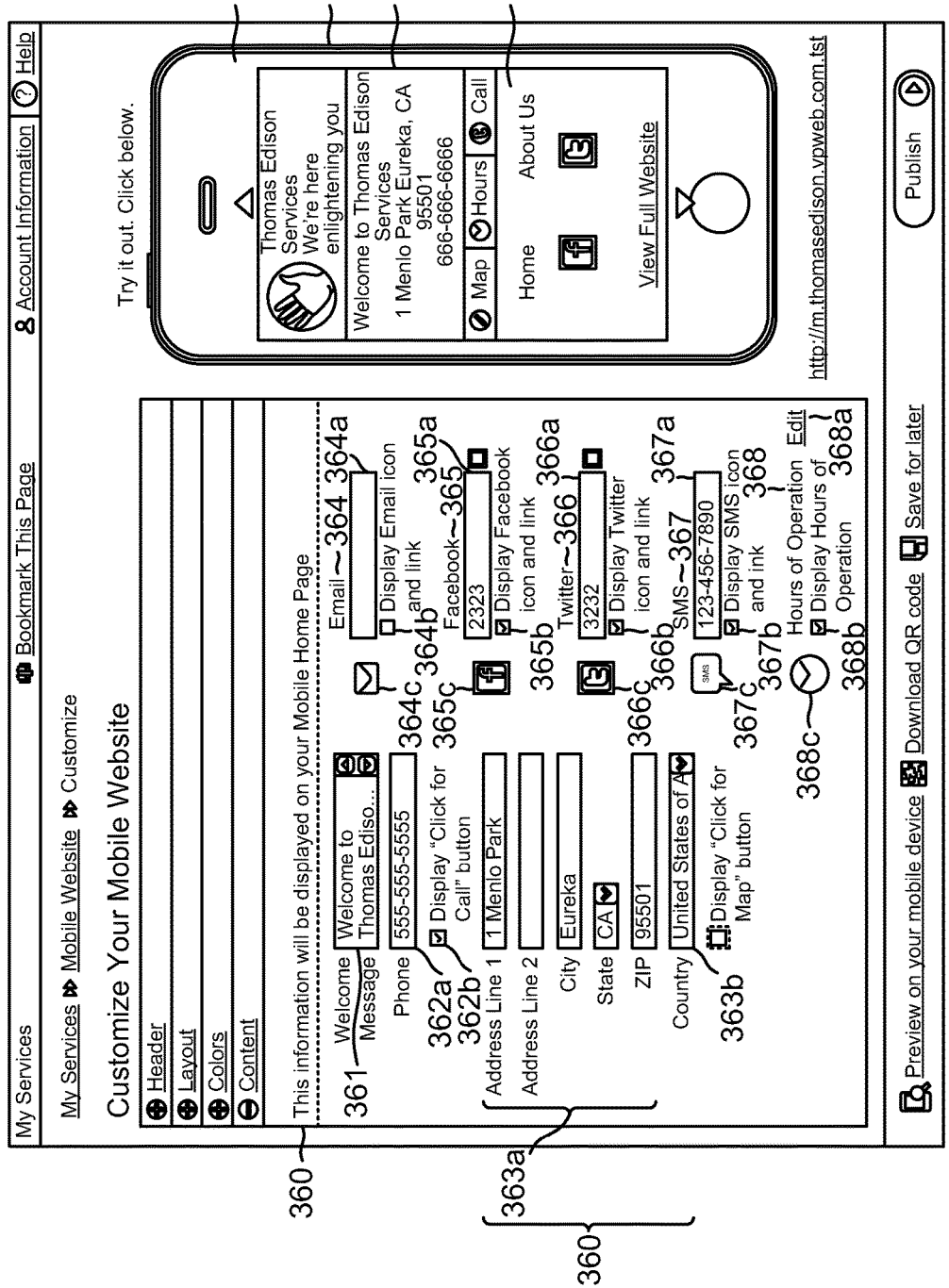
Figure 10N:
Figure 10O:
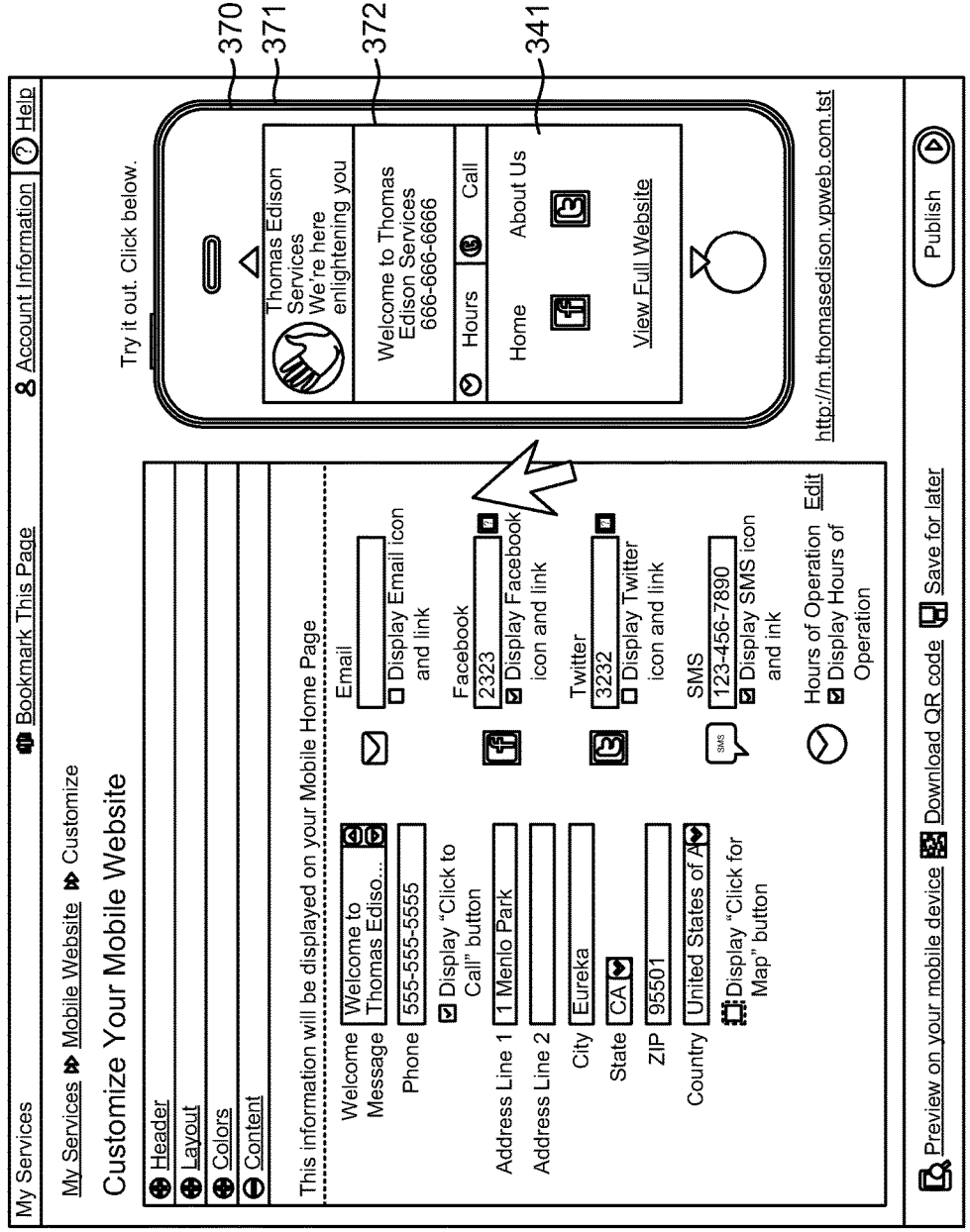

FIGS. 10A-10O illustrate a set of exemplary web pages that are displayed as a user configures and manages a mobile version of a website. FIG. 10A illustrates an example website management page 300 that a user may be presented with in order to configure their website services and edit and manage their website. The website management page 300 includes, among other links, an edit link 301 which causes a website editor to load when a user clicks on the link. In an embodiment, the website editor is downloaded to the client machine to execute in the client browser and interacts with the website building tool. The website management page 300 also includes a mobile website management link 302. When a user clicks on the mobile website management link 302, a mobile website management page, such as 310 in FIG. 10B. The mobile website management page 310 includes an edit link 312, which links to the mobile website configuration page 320 illustrated in FIG. 10C.

The mobile website configuration page 320 includes a user interface with configuration options for configuring the look and function of the mobile version of the user's website. In an embodiment, if a mobile website has not yet been created when the user clicks on the link 312, a mobile version of the www. website, i.e., a m. website, is automatically generated by the mobile website generation engine 172 by selecting mobile website assets from the website assets database 192 that match corresponding assets of the www. website. The mobile website generation engine 172 may generate automatic device detection page code and navigation control interface code within the m. web page that gets executed by a mobile device browser that requests the m. web page and which causes the mobile device browser to automatically provide navigation controls suitable for a particular mobile device requesting the m. page. For example, a m. web page generated based on a www. page which has navigation buttons in a navigation area may have the navigation buttons replaced by sliders or links on the m. page.

Similarly, the mobile website generation engine 172 may generate automatic device detection page code and audio/video player invocation code that gets executed by a mobile device browser that requests the m. web page and which causes the mobile device browser to automatically invoke an audio/video player playable by the mobile device.

Referring again to FIG. 10C, in the embodiment shown, the mobile website configuration page 320 includes different sections 330, 340, 350, 360 of the interface for configuring the header, the layout, the colors, and the content, respectively, of the user's mobile website. Other embodiments may provide different tabs, popups, windows, or pages for configuring the different aspects, such as but not limited to the header, the layout, the colors, and the content, of the mobile website. In the embodiment shown, each configuration section 330, 340, 350, 360 is displayable in either an expanded view or a collapsed view. A section 330, 340, 350, 360 may be expanded or collapsed, for example, by clicking anywhere on the header of each section 330, 340, 350, 360, or on a button (e.g., an expand/collapse icon), a hyperlink, or other suitable control. Clicking on the header, button, hyperlink or other control, will expand the section to display various configuration options if it is open or collapse the section (to remove the configuration options from view) if it is displayed.

The mobile website configuration page 320 may also include a dynamic mobile device simulator 370 which not only allows a user to preview changes to the mobile website prior to publishing the website, but also allows the user to try out functionality of the mobile website in a live manner. Details of the simulator are discussed in a later section, but for the present discussion it is sufficient to understand that the simulator 370 includes an image 371 of a mobile device that includes a display screen 372 on which a m. web page is rendered. Changes made to the m. website configuration using the mobile website configuration tool 178 are preferably automatically updated to the m. web page displayed on the display screen 372 of the mobile device simulator 370.

In an embodiment, the mobile website configuration page 320 defaults to displaying the Header section 330 in an expanded view, with a default matching header 331a selected (as indicated by the highlighted outline around the header option 331a) and displayed as the header in the m. web page rendered in the display screen 372 of the simulator 370.

The Header section 330 may display a plurality of different header options 331a, 331b, 331c, 331d available for selection by the user for use as the m. website header instead of the default matching header 331a. For example, in the header configuration section 330, header options include the default matching header option 331a which is the header selected by the system that "matches" the header of the www. website, header option 331b which includes the header text of the www. website header with an image positioned to the left of the header text, header option 331c which includes the image positioned to the right of the text, and header option 331d which includes the header text without any image. When a user navigates to the header section 330 of the mobile website configuration page 320, the header option corresponding to the current m. website is selected, indicated by a highlighted border around the selected header option. Thus, the first time a user navigates to the header section 330 of the mobile website configuration page 320, the matching header 331a selected by the system is selected by default. Then, when the user clicks one of the header options 331a, 331b, 331c, 331d, the selected header option is highlighted and the m. web page loaded in the display screen 372 of the simulator 370 updates.

FIG. 10D shows the mobile website configuration page 320 upon selection by the user of the header 331b. As shown, the border of header 331b is highlighted to indicate that it is selected. Additionally, the dynamic preview simulator 370 is automatically updated by the server to display the selected header 331b on the display screen 372 of the mobile device simulator 370.

In an embodiment, the content of the header is editable. A user can edit the content of a selected header by clicking on an Edit Header button or link 332b, which opens a header editing dialog 400, as shown in FIG. 10E. The editing dialog allows the user to select a text container 412 and edit the text contained in the text container 412, add text (button Add Text 401), add image(s) (using button Add Image 402), and add or change the background image (using button Change Background Image 403). When a user selects the Add Text 401 button, a text container is placed in the header area and the user can enter text and position the text container where desired within the header boundaries. Similarly, when a user selects the Add Image 402 button, an image container is inserted into the header area, and a dialog (not shown) is presented which assists the user in browser for, and uploading, a selected image for insertion into the image container. The image container may also be placed by the user anywhere within the header area.

FIG. 10F shows the header editing dialog 400 after the user has selected text container 412 by clicking on the text container 412 with mouse cursor 321. As shown, such action results in the opening of a text editing dialog 410, which includes a text input box 420 pre-populated with the user-editable contents of the text container 412, along with font selection buttons 421, 422 and 423. The user can make changes to the text by editing the contents in the text input box 420 and selecting the desired font and size using the text configuration buttons 421, 422, 423.

When satisfied with the changes, the user clicks on the OK button 425 to close the dialog 410 and trigger the updating of the text changes to both the display of the corresponding header option 331b in the header section 330, and to the m. web page displayed on the display screen 372 of the simulator 370, as shown in FIG. 10G.

FIG. 10H shows the mobile website configuration web page 320 when the user selects the Layout section 340, resulting in the collapsing of the Header section 330 and the expansion of the Layout section 340. The Layout section 340 displays a plurality of different available layouts 341a, 341b, 341c for the web page currently being edited. The currently selected layout 341a is highlighted to indicate selection, and the corresponding m. web page displayed in the display screen area 372 of the simulator 370 reflects the currently selected layout. A user can change the layout by clicking, and thereby selecting, a desired layout, for example 341c. If the selected layout 341c is different than the current layout (e.g., 341a), highlighting is removed from the current layout 341a and added to the selected layout 341c to indicate current selection, and the corresponding m. web page displayed in the display screen area 372 of the simulator 370 is updated with the new layout selection 341c, as shown in FIG. 10I.

In an embodiment, the Layout section 340 includes a Manage Pages button 342 which, when clicked, and as shown in FIG. 10J, opens a page ordering dialog 430. The page ordering dialog 430 provides a grid 431 listing the page names and a set of radio buttons indicating which pages should be listed in the navigation panel on each page. Each page can have navigation buttons to a different set of pages, if desired. The name of each page, along with the size and type of font, can also be edited by the user. The default font is selected by the system to match the font(s) in the www. website.

The Color configuration section 350 may display a plurality of different color scheme options 351a, 351b, 351c, 351d available for selection by the user for use as the m. website color scheme. The currently selected color scheme 351a is highlighted. A given color scheme may define a set of colors to be used for various components. For example, a given color scheme may define specific colors for each of the header background, the web page background, the web page text color, the button color, and the button text color, among others. In an embodiment, the color selections apply to all pages on the website. When a color scheme is clicked, the m. web page displayed on the display screen 372 of the simulator is updated with the colors from the scheme.

The color configuration section 350 may also include more advanced color options that allow the user to pick custom colors/schemes for each of the header, the navigation controls (e.g., buttons), text, navigation control text (e.g., button text color), and background. In an embodiment, if a user is still using the automatically-selected matching colors (to their main www. website), and a new header or layout is selected, the server 170 automatically changes the colors to match the newly-selected header or layout. When a user selects one of the buttons 352a, 352b, 352c, 352d, 352e for customizing the header, button color, button text, text, or background, a color picker (not shown) is displayed to allow the user to select a custom color. In a preferred embodiment, selection of a color from the picker will update the selected option only. Color updates in the configuration options 351a, 351b, 351c, 351d, 352a, 352b, 352c, 352d, 352e automatically trigger corresponding changes to the m. web page displayed in the simulator 370 but are not published to the hosted website database 194 until the user requests the page to be published.

FIG. 10L shows the highlighted color scheme 351b after selection by the user, and the corresponding update to display 372 in the simulator 370.

Moving next to the Content configuration section 360, shown in FIG. 10M, The Content configuration section 360 allows a user to customize content on their mobile homepage. This section allows the user to add a welcome message 361, phone number 362, address 363, email address 364, and functional widgets, such as but not limited to: Click to Call functionality 362b, Email functionality 3664b, FACEBOOK social networking site functionality 365b, TWITTER social networking site functionality 366b, SMS texting functionality 367b, Map functionality 363b, and Hours of Operation functionality 368. In an embodiment, the Company Name and Company Message are pulled from the www. website. To add a functional widget, the user clicks the "Display <widget>" checkbox 362b, 363b, 364b, 365b, 366b, 367b, 368b, where <widget> is the particular widget function such as Click to Call 362b, Email 364b, FACEBOOK social networking site link 365b, TWITTER social networking site link 366b, SMS 367b, Hours of Operation 368b, Click for Map 363b, or other types of functional widgets, and adds any required corresponding information such as phone number, email address, FACEBOOK social networking site link, TWITTER social networking site link, SMS texting link, address, hours of operation, etc. Then, for any functional widget in the Content configuration section 360 having an associated checkbox option to display the functional widget, the mobile website configuration server 170 enables the associated functional widget when its corresponding "Display <widget>" checkbox is checked and automatically adds the corresponding functional widget icon to the m. web page and generates and adds corresponding functional widget code to add the functionality of the widget (or at least the functionality of the Application Program Interface (API) of the corresponding widget) to the m. web page. The m. web page is then displayed on the display screen 372 of the simulator 370, as shown in FIG. 10O.

The Hours of Operation widget may trigger the popup of an hours of operation dialog 440, shown in FIG. 10N, which presents the user with a grid of days of the week and associated checkboxes 441 followed by user-editable input boxes for opening time 442 and closing time 443. A user can simply check the checkboxes 441 associated with the days of the week that the user's business is open, and edit or select hours from respective drop-down lists 442, 443 for each corresponding opening time and closing time. When the user clicks the "Save" button 445, the Hours of Operation are added to the m. web page and the m. web page displayed on the display screen 372 of the simulator 370 is updated.

As described above, in preferred embodiments of the present invention, the mobile website management page 320 includes a dynamic preview simulator 370 which displays a depiction 371 of a mobile device, such as a smartphone, that includes a display screen 372 displaying the mobile web page currently being edited or configured via the mobile website management page 320 graphical user interface. The mobile web page displayed on the simulator device screen 372 depicts the m. web page as it is currently configured within the mobile website configuration tool 178 and 162, including the currently selected header, layout, color(s), and content. As the user makes changes to the selections of the header, layout, color(s), and/or content, the changes are reflected in the mobile web page displayed in the display screen 372 of the dynamic preview simulator 370.

Furthermore, the mobile web page displayed on the simulator screen 372 is operationally functional. If the user clicks on the links on the m. web page on the simulator, it loads the page associated with the link on the display screen of the simulator. Changes made within the mobile configuration tool 178 are automatically converted into .html code in the m. web page and loaded into the display screen 372 of the simulator 370. This way, the user can see how changes to the m. web page configuration selections affect the look and feel of the web page, and can test them out, prior to publishing the changes to the hosted m. website.

Figure 11:
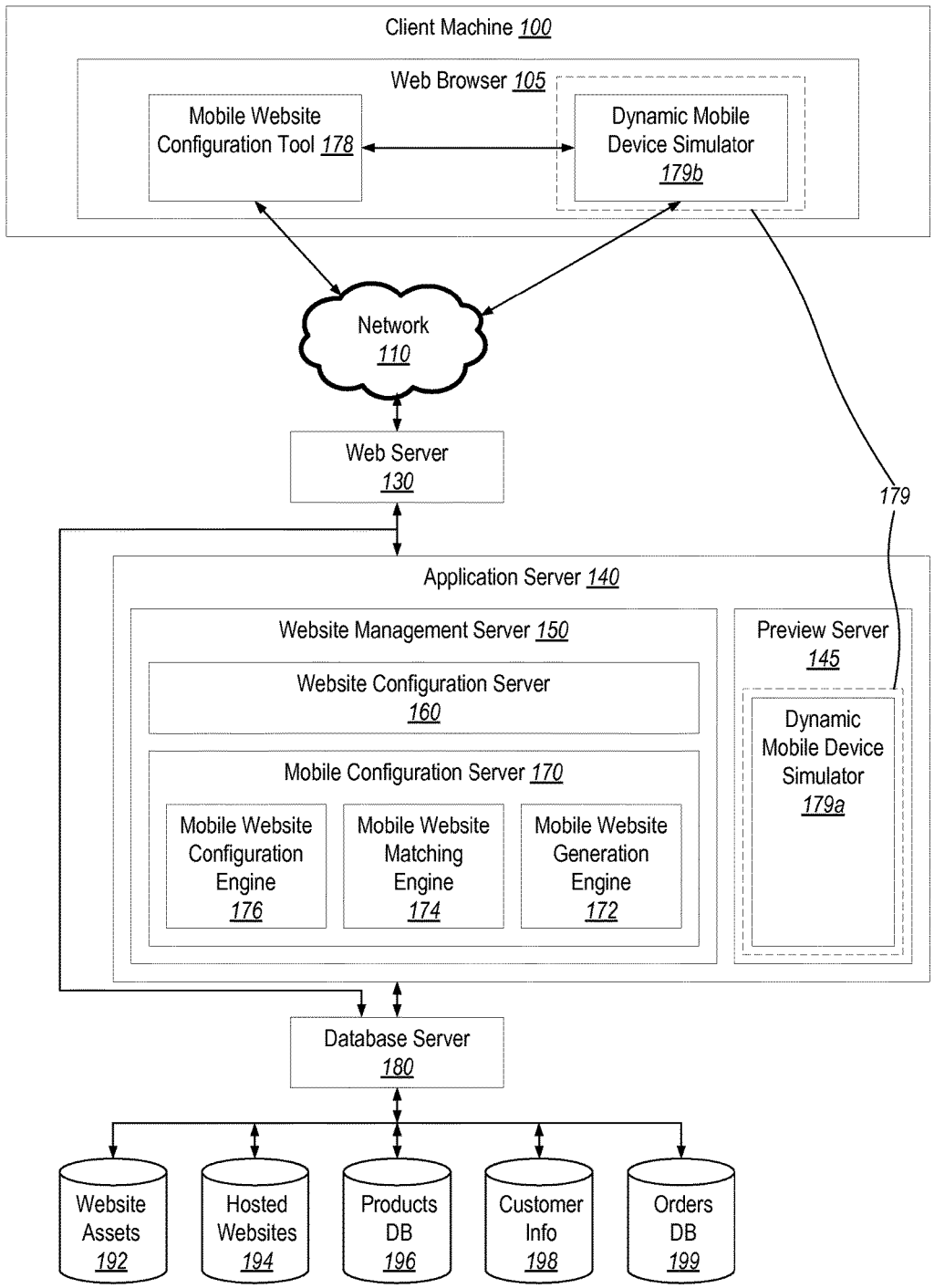
FIG. 11 is a system diagram of an embodiment of a system and corresponding interactional operations between the mobile website configuration tool and a dynamically modifiable mobile device simulator.
Figure 12:
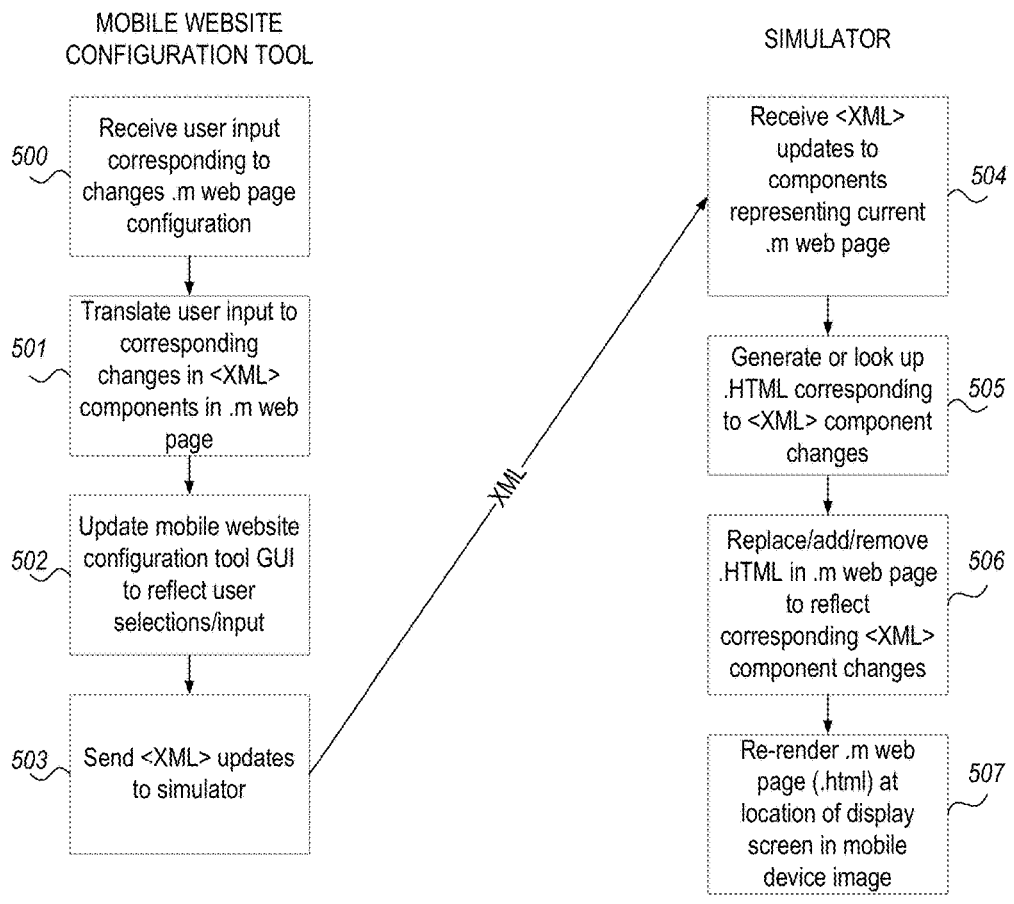
FIG. 12 is an operational diagram illustrating the interactional operations between the mobile website configuration tool and mobile device simulator of FIG. 11.
Figure 12:
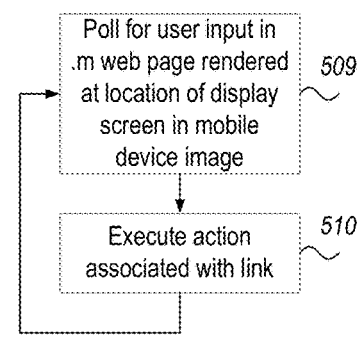

FIG. 11 is a system diagram, and FIG. 12 is an operational diagram, of an embodiment of the system and corresponding interactional operations between the mobile website configuration tool 178 and the simulator tool 179. Referring first to the system diagram in FIG. 11, generally, when the user navigates to the mobile website configuration page 320 (see FIGS. 10A-10O) to edit or change the mobile website configuration, a mobile website configuration tool 178 is downloaded to the client machine 100 from the mobile configuration server 170. The mobile website configuration tool 178 executes in the web browser 105 of the client machine. In one embodiment, the website configuration tool 178 is a document editing platform that uses Web programming techniques such as JAVASCRIPT, AJAX (Asynchronous JAVASCRIPT and XML) (more generally referring to any technique that allows JAVASCRIPT to communicate with the server without a page refresh), and Dynamic HMTL (DHTML) (a web programming technique for creating dynamic behavior on a web page), to render documents and allow users to manipulate them. In an embodiment, the mobile website configuration tool 178 allows a user to reposition elements, change colors, fonts, font styles, sizes, change images, add images, and many other features one would expect to find in a basic image editing application. In this embodiment, much of the workload such as image and text rendering is performed on the server, such as the Preview Server 145.

In an alternative embodiment, the mobile website configuration tool 178 is written in the well-known JavaScript and utilizes well-known technologies such as Web fonts (i.e., a font object downloaded from a server that can be attached to a web page for styling text elements and does not need to be installed on the client machine to function) and other markup language technologies to provide rich client-side editing capabilities, such as image and text rotation, in-place rich text editing, and word art. In this type of embodiment, most of the workload is performed on the client machine 100 because the fonts are downloaded as needed.

As also indicated in FIG. 11, when the mobile website configuration page 320 is displayed, it includes a section of JAVASCRIPT web programming code which triggers the download of a script implementing a client-side dynamic mobile device simulator 179.

When the mobile website configuration page 320 is loaded into the client browser 105, independent scripts representing the mobile website configuration tool 178 and the dynamic mobile device simulator 179 are each started up. The dynamic mobile device simulator 179 receives updates representing changes to the current m. web page from the mobile website configuration tool 178 as the user makes the changes. The dynamic mobile device simulator 179 interprets the received changes and automatically alters the m. web page with .html code representing the change(s) and re-renders the m. web page within the display screen 372 area of the rendered image 370 of the mobile device.

For example, suppose a user selects a change to the layout of the m. web page using the mobile website configuration tool 178. In this case, the layout change is communicated from the mobile website configuration tool 178 JAVASCRIPT web programming code to the dynamic mobile device simulator 179 JAVASCRIPT web programming code. The dynamic mobile device simulator 179 JAVASCRIPT web programming code interprets the layout change to select corresponding .html code representing the layout and to replace the current .html code that implements the layout in the current m. web page with the corresponding selected .html code representing the new layout. The dynamic mobile device simulator 179 JAVASCRIPT web programming code then re-renders at least the m. web page within the image of the mobile device in the mobile website configuration page 320 on the user's display.

In an embodiment, .html code corresponding to each possible layout, color scheme, and content is stored in the website assets database 192. The dynamic mobile device simulator 179 JAVASCRIPT web programming code requests .html code corresponding to component changes as indicated by communications from the mobile website configuration tool 178 JAVASCRIPT web programming code, and replaces associated sections of the .html of the m. web page to dynamically update the current m. web page.

Because the m. web page is actually .html, and the m. web page is rendered in the display screen area 372 of the mobile device image 371 depicting the simulator 370, the m. web page rendered therein is also operationally functional. That is, a user viewing the mobile website configuration page 320 can click on a navigation button or other interactive function displayed in the m. web page on the display screen 372 of the simulator 370, and the function of the button will work. For example, if a user is currently viewing the Home Page of the m. website in the simulator 370 and then clicks on the "About Us" navigation button, the simulator will load the "About Us" page in the display screen 372. In this manner, the simulator dynamically changes itself as the user makes changes to the mobile website configuration. This also allows a user to dynamically change the m. website and try it out immediately on a simulated mobile device 370 prior to publishing the changes to the hosted website database. There is no need to first publish or save and then preview the m. web page.

FIG. 12 shows an operational embodiment of the interactions between the mobile website configuration tool 178 and the simulator 179 scripts. As a user enters selections using the GUI of the mobile website configuration tool 178, the mobile website configuration tool 178 receives the user input corresponding to such changes (step 500) and translates or interprets the user input to changes in corresponding <XML> components of the current m. web page (step 501). Changes can be to content in text containers (i.e., text edits), removal/addition/changing of images in image containers, changes to positions of text or image containers, changes to the website header selection, the layout selection, the color scheme selection, and/or changes to the content and/or functional widgets incorporated into the mobile website. The mobile website configuration tool 178 correspondingly updates the GUI to reflect the configuration selections and/or content edits (step 502), and sends the updated <XML> components to the simulator 179 script.

When the simulator 179 script receives an <XML> component update, (step 504), it either generates or looks up in the website asset database 192 corresponding .html code that implements the <XML> component updates (step 505). The simulator 179 then alters the m. web page .html so as to remove unneeded .html code, add new .html code, and/or replace .html code to effect the changes in the current m. web page as represented by the <XML> updates (step 506). The simulator 179 then re-renders the m. web page .html so that it appears in the location of the display screen 372 in the mobile device image 371 (step 507).

Meanwhile, the simulator 179 script also polls for user input in the m. web page as rendered at the location of the display screen 372 in the mobile device image 371 (step 509). If an action such as a "mouse-click/mouse-up" action occurs, the simulator executes the action indicated by the .html code associated with the link (step 510).

In the foregoing specification the present invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

Furthermore, it is to be understood that all systems and methods described herein can be embodied in hardware, including one or more processors and associated non-transitory computer-readable memory storing computer-readable program instructions which, when executed by the one or more processors, implement the servers, systems, and methods described herein.

What is claimed is:

1. A mobile web site configuration system for enabling a user to configure a mobile-optimized website, the mobile-optimized website for display on a mobile device and being a mobile-optimized version of a corresponding conventional website, the system comprising:
   one or more processors;
   non-transitory computer-readable memory storing computer-readable program instructions, which, when executed by the one or more processors implement a graphical user interface which displays a preview of a mobile web page of a mobile website associated with the conventional website, the mobile web page comprising at least a header and a layout,
   the graphical user interface comprising a plurality of tools each for independently configuring at least the header and the layout of the mobile web page, the plurality of tools comprising:
      a header configuration tool having header configuration tool client-side code executing on the client machine in communication with header configuration tool server-side code executing on a server machine, the header configuration tool client-side code configured to receive from the header configuration tool server-side code a plurality of representations of different header images available to replace the header in the mobile web page, the header configuration tool client-side code further configured to display a plurality of the received representations of header images and associate therewith respective header selection controls and to receive a selection, from a user of the client machine via one of the header selection controls, of one of the displayed representations of header images, the header configuration tool client-side code further configured to generate an indication of the selected image representation in a browser-independent format and to send the indication to the header configuration tool server-side code, the header configuration tool server-side code interpreting the browser-independent format indication of the selected image representation to configure the mobile-optimized version of the conventional web page with browser-renderable instructions for replacing the header in the mobile web page with the header image associated with the selected image representation and rendering the header image associated with the selected image representation; and
      a layout configuration tool having layout configuration tool client-side code executing on the client machine in communication with layout configuration tool server-side code executing on a server machine, the layout configuration tool client-side code configured to receive from the layout configuration tool server-side code a plurality of different layout representations, the layout configuration tool client-side code further configured to display a plurality of the received layout representations and associate therewith respective layout selection controls and to receive a selection, from a user of the client machine via one of the layout selection controls, of one of the different layout representations, the layout configuration tool client-side code further configured to generate an indication of the selected layout representation in a browser-independent format and to send the indication to the layout configuration tool server-side code, the layout configuration tool server-side code interpreting the browser-independent format indication of the selected layout representation to configure the mobile-optimized version of the conventional web page with browser-renderable instructions for rendering the layout associated with the selected layout representation.

2. The mobile website configuration system of claim 1, wherein at least one of the different representations of header images is of a mobile-optimized matching header that matches a corresponding header in a corresponding conventional website.

3. The mobile website configuration system of claim 2, wherein the matching header is automatically selected as a default header by the header configuration tool.

4. The mobile website configuration system of claim 3, wherein the automatically selected matching header is included in an automatically generated mobile-optimized version of the corresponding conventional website.

5. The mobile website configuration system of claim 1, further comprising:
   a functional content configuration tool configured to offer a plurality of different functional content options, each functional content option having an associated functional content selection control, the functional content configuration tool further configured to receive one or more selections of the different functional content options and to automatically configure the mobile-optimized version of the conventional web page with browser-renderable instructions to enable the selected functional content options.

6. The mobile website configuration system of claim 5, wherein at least one selected functional content option comprises a click-to-call function for allowing a user of a mobile device to automatically place a call when a user clicks on a phone number displayed on the mobile-optimized website.

7. The mobile website configuration system of claim 5, wherein at least one selected functional content option comprises a click-for-map function, the click-for-map function having an associated address input, the click-for-map function for automatically displaying a map which includes the associated address when a user clicks on a click-for-map control displayed on the mobile-optimized website.

8. The mobile website configuration system of claim 7, wherein the associated address is received by the functional content configuration tool during configuration of the mobile-optimized website.

9. The mobile website configuration system of claim 5, wherein at least one selected functional content option comprises a click-to-email function for allowing a user of a mobile device to automatically email a message to an associated input email address when a user clicks on a click-to-email control displayed on the mobile-optimized website.

10. The mobile website configuration system of claim 9, wherein the input email address associated with the displayed click-to-email control is received by the functional content configuration tool during configuration of the mobile-optimized website.

11. The mobile website configuration system of claim 5, wherein at least one selected functional content option comprises a social media function for allowing a user of a mobile device to automatically send or post a message to an associated input social media link when a user clicks on an associated social media control displayed on the mobile-optimized website.

12. The mobile website configuration system of claim 11, wherein the associated input social media link associated with the displayed associated social media control is received by the functional content configuration tool during configuration of the mobile-optimized website.

13. The mobile website configuration system of claim 12, wherein the social media link comprises a social media site address.

14. The mobile website configuration system of claim 12, wherein the social media link comprises a texting link.

15. The mobile website configuration system of claim 12, wherein the social media link comprises an email address.

16. The mobile website configuration system of claim 5, wherein at least one selected functional content option comprises an hours-of-operation function, the hours-of-operation function having an associated input set of hours of operation, the hours-of-operation function for automatically displaying the input hours of operation on a mobile-optimized web page of the mobile-optimized website.

17. The mobile website configuration system of claim 16, wherein the input set of hours of operation is received by the functional content configuration tool during configuration of the mobile-optimized website.

18. The mobile website configuration system of claim 1, the mobile website configuration tool further comprising a functionally-operational mobile device simulator which simulates display of the mobile-optimized website on a mobile device.

* * * * *